(12) United States Patent
Liu et al.

(10) Patent No.: US 11,227,918 B2
(45) Date of Patent: Jan. 18, 2022

(54) MELT ANNEAL SOURCE AND DRAIN REGIONS

(71) Applicant: Taiwan Semiconductor Manufacturing Company, Ltd., Hsinchu (TW)

(72) Inventors: Su-Hao Liu, Jhongpu Township (TW); Wen-Yen Chen, Hsinchu (TW); Li-Heng Chen, Taichung (TW); Li-Ting Wang, Hsinchu (TW); Liang-Yin Chen, Hsinchu (TW); Huicheng Chang, Tainan (TW); Yee-Chia Yeo, Hsinchu (TW); Ying-Lang Wang, Tien-Chung Village (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/422,123

(22) Filed: May 24, 2019

(65) Prior Publication Data
US 2020/0044025 A1 Feb. 6, 2020

Related U.S. Application Data

(60) Provisional application No. 62/712,603, filed on Jul. 31, 2018.

(51) Int. Cl.
*H01L 29/08* (2006.01)
*H01L 29/66* (2006.01)
(Continued)

(52) U.S. Cl.
CPC .... *H01L 29/0847* (2013.01); *H01L 21/02532* (2013.01); *H01L 21/26506* (2013.01);
(Continued)

(58) Field of Classification Search
CPC .......... H01L 29/0847; H01L 21/28518; H01L 21/26506; H01L 21/02532;
(Continued)

(56) References Cited

U.S. PATENT DOCUMENTS 5,270,227 A * 12/1993 Kameyama ....... H01L 21/26586
148/DIG. 1
9,093,530 B2 7/2015 Huang et al.
(Continued)

FOREIGN PATENT DOCUMENTS

CN 103999199 A 8/2014
CN 107799422 A 3/2018
(Continued)

*Primary Examiner* — Marcos D. Pizarro
*Assistant Examiner* — Sue Tang
(74) *Attorney, Agent, or Firm* — Slater Matsil, LLP

(57) ABSTRACT

A method includes forming a gate stack on a first portion of a semiconductor substrate, removing a second portion of the semiconductor substrate on a side of the gate stack to form a recess, growing a semiconductor region starting from the recess, implanting the semiconductor region with an impurity, and performing a melt anneal on the semiconductor region. At least a portion of the semiconductor region is molten during the melt anneal.

21 Claims, 27 Drawing Sheets

(51) Int. Cl.
*H01L 29/78* (2006.01)
*H01L 29/161* (2006.01)
*H01L 27/092* (2006.01)
*H01L 21/8238* (2006.01)
*H01L 21/02* (2006.01)
*H01L 21/265* (2006.01)
*H01L 21/285* (2006.01)

(52) U.S. Cl.
CPC ............. *H01L 21/28518* (2013.01); *H01L 21/823814* (2013.01); *H01L 21/823821* (2013.01); *H01L 21/823828* (2013.01); *H01L 27/0924* (2013.01); *H01L 29/161* (2013.01); *H01L 29/66545* (2013.01); *H01L 29/66795* (2013.01); *H01L 29/785* (2013.01)

(58) Field of Classification Search
CPC ..... H01L 21/823828; H01L 21/823814; H01L 21/823821; H01L 27/0924; H01L 29/161; H01L 29/785; H01L 29/66795; H01L 29/66545; H01L 29/665; H01L 29/165; H01L 29/7848; H01L 21/823871
See application file for complete search history.

(56) References Cited

U.S. PATENT DOCUMENTS

| | | | |
|---|---|---|---|
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,607,987 B2 | 3/2017 | Giles et al. | |
| 9,608,116 B2 | 3/2017 | Ching et al. | |
| 9,711,608 B1 | 7/2017 | Duriez et al. | |
| 9,806,171 B2 | 10/2017 | Kwok et al. | |
| 9,893,183 B2 | 2/2018 | Kuang et al. | |
| 10,170,314 B2 | 1/2019 | Jensen et al. | |
| 10,325,911 B2 | 6/2019 | Lu et al. | |
| 10,490,552 B2 | 11/2019 | Lee et al. | |
| 10,593,775 B2 | 3/2020 | Yeo et al. | |
| 10,707,334 B2 | 7/2020 | Chui et al. | |
| 11,043,570 B2 | 6/2021 | Teo et al. | |
| 2013/0288438 A1* | 10/2013 | Jensen | H01L 29/66628 438/197 |
| 2015/0021696 A1* | 1/2015 | Sung | H01L 29/165 257/368 |
| 2015/0270342 A1 | 9/2015 | Tsai et al. | |
| 2016/0372599 A1 | 12/2016 | Jensen et al. | |
| 2017/0213739 A1 | 7/2017 | Gluschenkov et al. | |
| 2017/0213889 A1 | 7/2017 | Gluschenkov et al. | |
| 2017/0256613 A1 | 9/2017 | Fung | |
| 2018/0190653 A1 | 7/2018 | Lu et al. | |
| 2018/0261598 A1* | 9/2018 | Adusumilli | H01L 21/26506 |

FOREIGN PATENT DOCUMENTS

| | | |
|---|---|---|
| CN | 108122979 A | 6/2018 |
| KR | 20150020956 A | 2/2015 |
| KR | 20170077854 A | 7/2017 |
| KR | 20180060906 A | 6/2018 |
| KR | 20180079161 A | 7/2018 |
| TW | 201730982 A | 9/2017 |
| TW | 201735154 A | 10/2017 |
| TW | 201743452 A | 12/2017 |

* cited by examiner

MELT ANNEAL SOURCE AND DRAIN REGIONS

PRIORITY CLAIM AND CROSS-REFERENCE

This application claims the benefit of the following provisionally filed U.S. patent application: Application Ser. No. 62/712,603, filed Jul. 31, 2018, and entitled "Melt Anneal Source and Drain Regions," which application is hereby incorporated herein by reference.

BACKGROUND

In integrated circuits, source/drain contact plugs are used for electrically coupling to the source and drain regions, which may be formed through epitaxy. The source/drain contact plugs are typically connected to source/drain silicide regions. The formation of the source/drain silicide regions includes forming contact openings by etching dielectric layers covering the source/drain regions, wherein the etched dielectric layers may include a silicon nitride layer and an oxide layer over the silicon nitride layer. The source/drain regions are thus exposed to the contact openings. An additional silicon nitride layer is formed conformally to cover the sidewalls and the bottoms of the contact openings. A second etching step is then performed to remove the bottom portions of the silicon nitride layer to reveal the epitaxy source/drain regions. A metal layer is then formed to extend into the contact openings, and an anneal process is performed to react the metal layer with the source/drain regions, resulting in source/drain silicide regions to be formed. The remaining portions of the contact openings are then filled with a metal(s) to form the source/drain contact plugs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
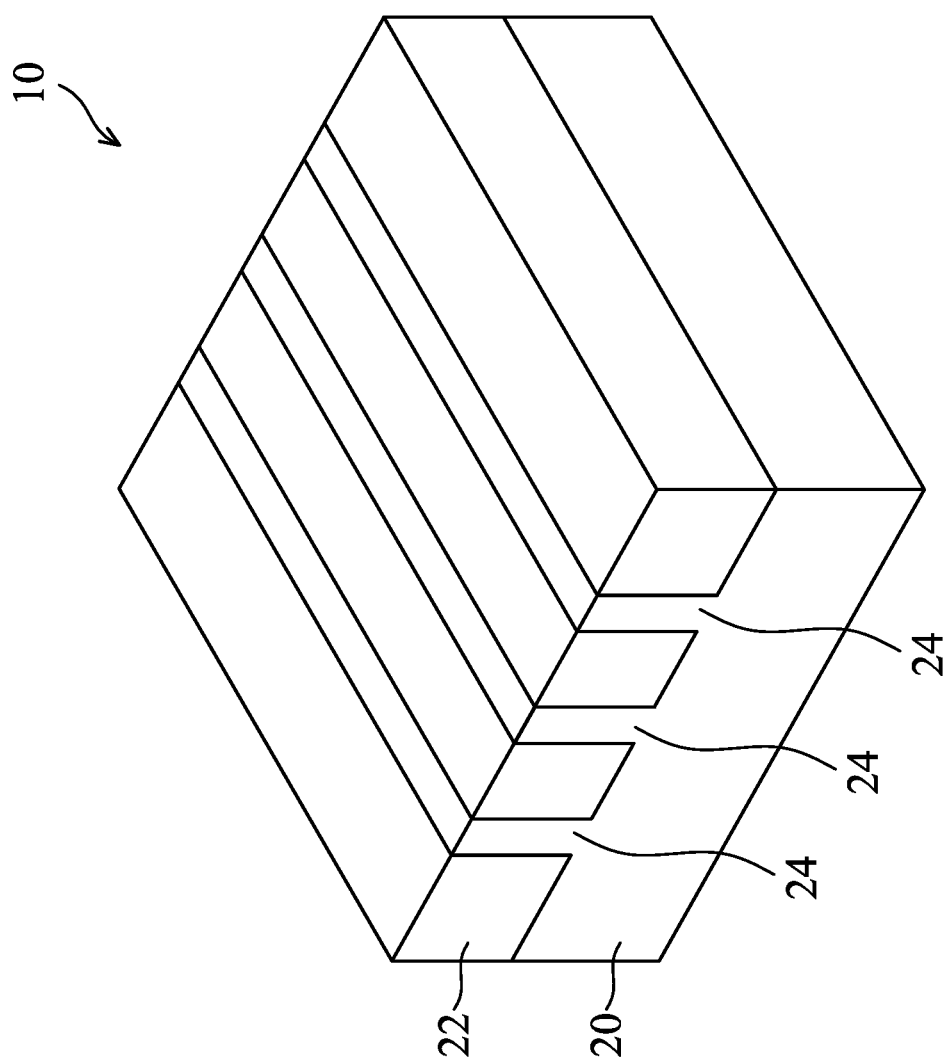
FIGS. 1 through 4, 5A, 5B 6A, 6B, 7, 8, 9A, 9B, 9C, 10 through 13, 14A, 14B, 14C, and 15 are perspective views and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various embodiments. The intermediate stages of forming the transistors are illustrated in accordance with some embodiments. Some variations of some embodiments are discussed. Throughout the various views and illustrative embodiments, like reference numbers are used to designate like elements. In the illustrated embodiments, the formation of Fin Field-Effect Transistors (FinFETs) is used as an example to explain the concept of the present disclosure. Planar transistors may also adopt the concept of the present disclosure. In accordance with some embodiments of the present disclosure, melt anneal is used to anneal the source and drain regions of the FinFETs, during which at least some portions of the source/drain regions are molten. Due to the melt anneal, the interface between the source/drain regions and the overlying silicide regions are curved, and hence the contact resistance to the source and drain regions is reduced.

Figure 21:
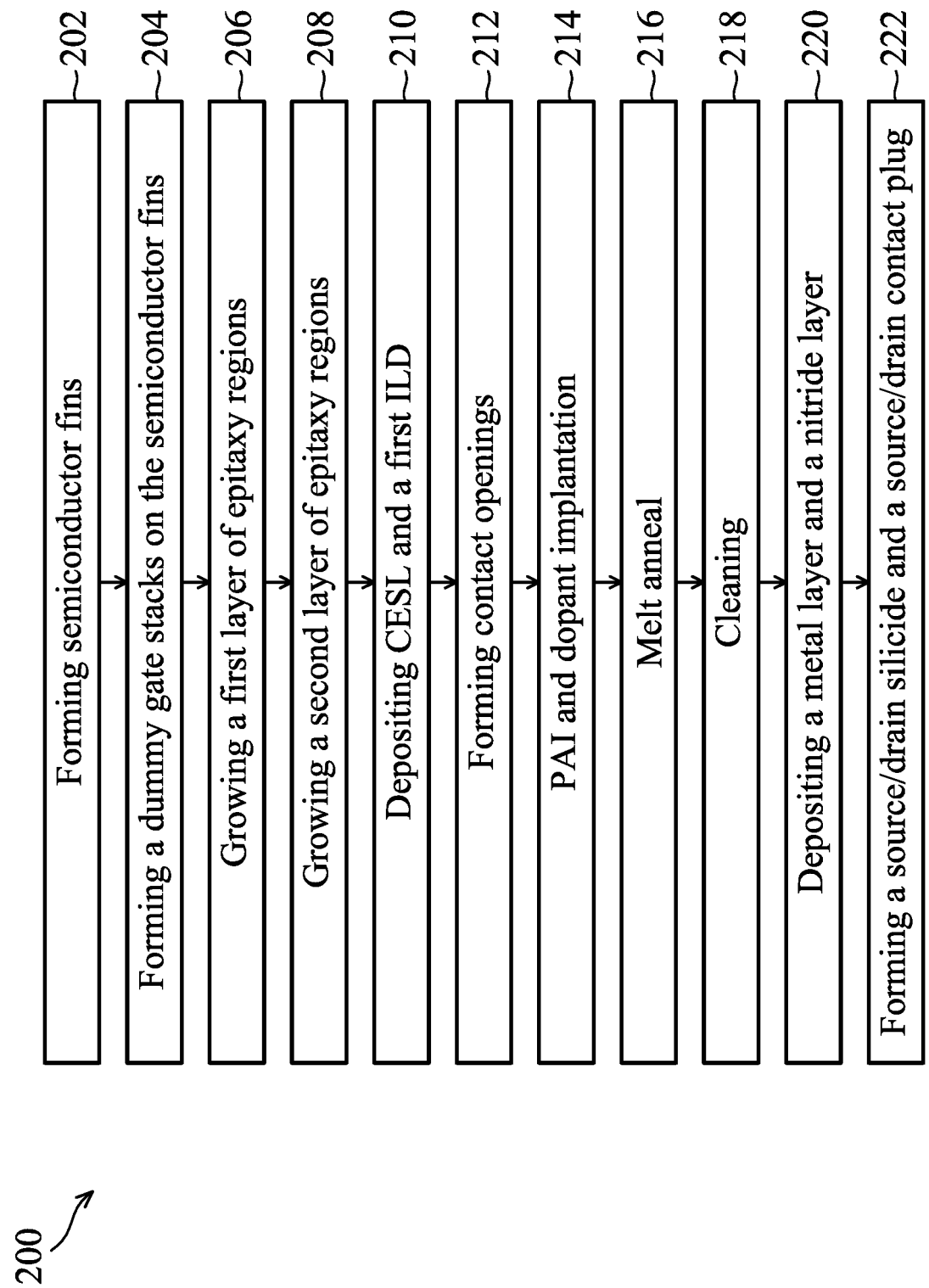
FIG. 21 illustrates a process flow for forming a FinFET in accordance with some embodiments.

FIGS. 1 through 4, 5A, 5B 6A, 6B, 7, 8, 9A, 9B, 9C, 10 through 13, 14A, 14B, 14C, and 15 illustrate the cross-sectional views and perspective views of intermediate stages in the formation of a Fin Field-Effect Transistor (FinFET) in accordance with some embodiments of the present disclosure. The processes shown in these figures are also reflected schematically in the process flow 200 shown in FIG. 21.

FIG. 1 illustrates a perspective view of an initial structure formed on wafer 10. Wafer 10 includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
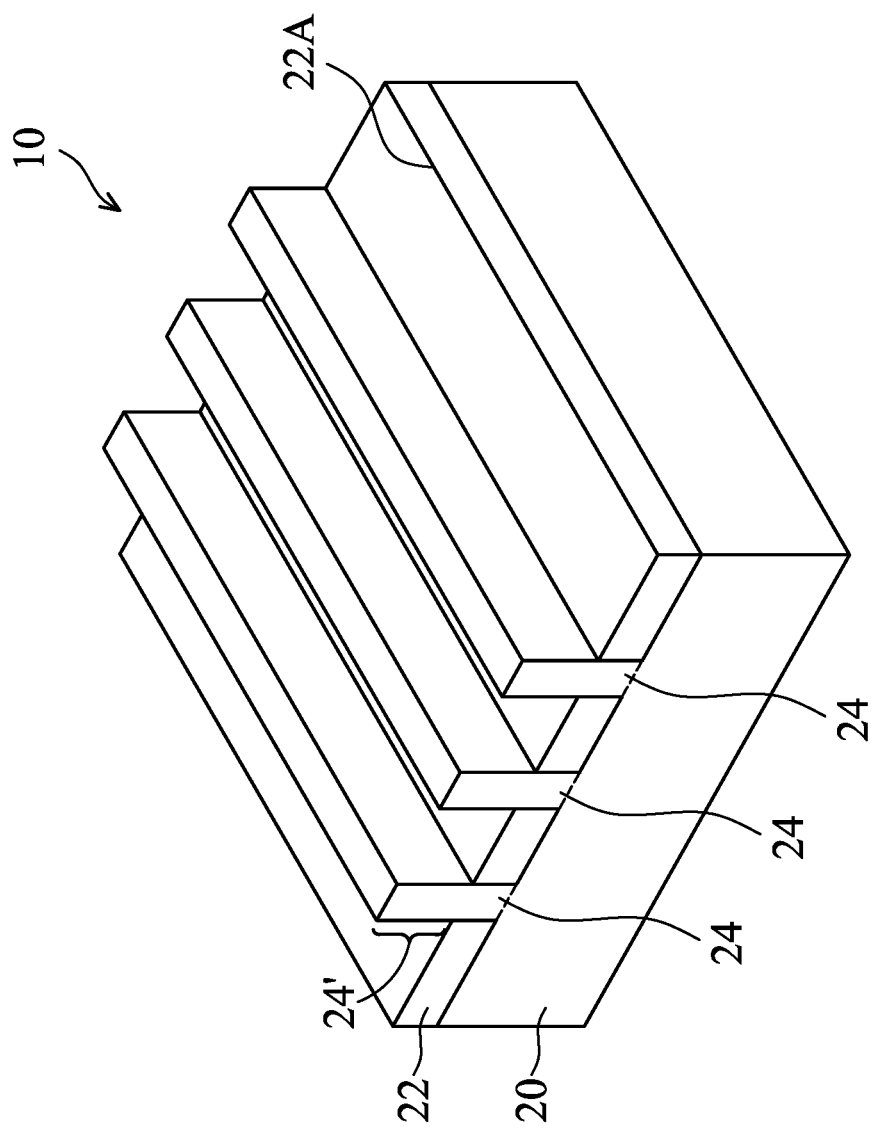

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 202 in the process flow 200 shown in FIG. 21. The etching may be performed using a dry etching process, wherein $HF_3$ and $NH_3$ are used as the etching gases. During the etching process, plasma may be generated. Argon may also be included. In accordance with alternative embodiments of the present disclosure, the recessing of STI regions 22 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
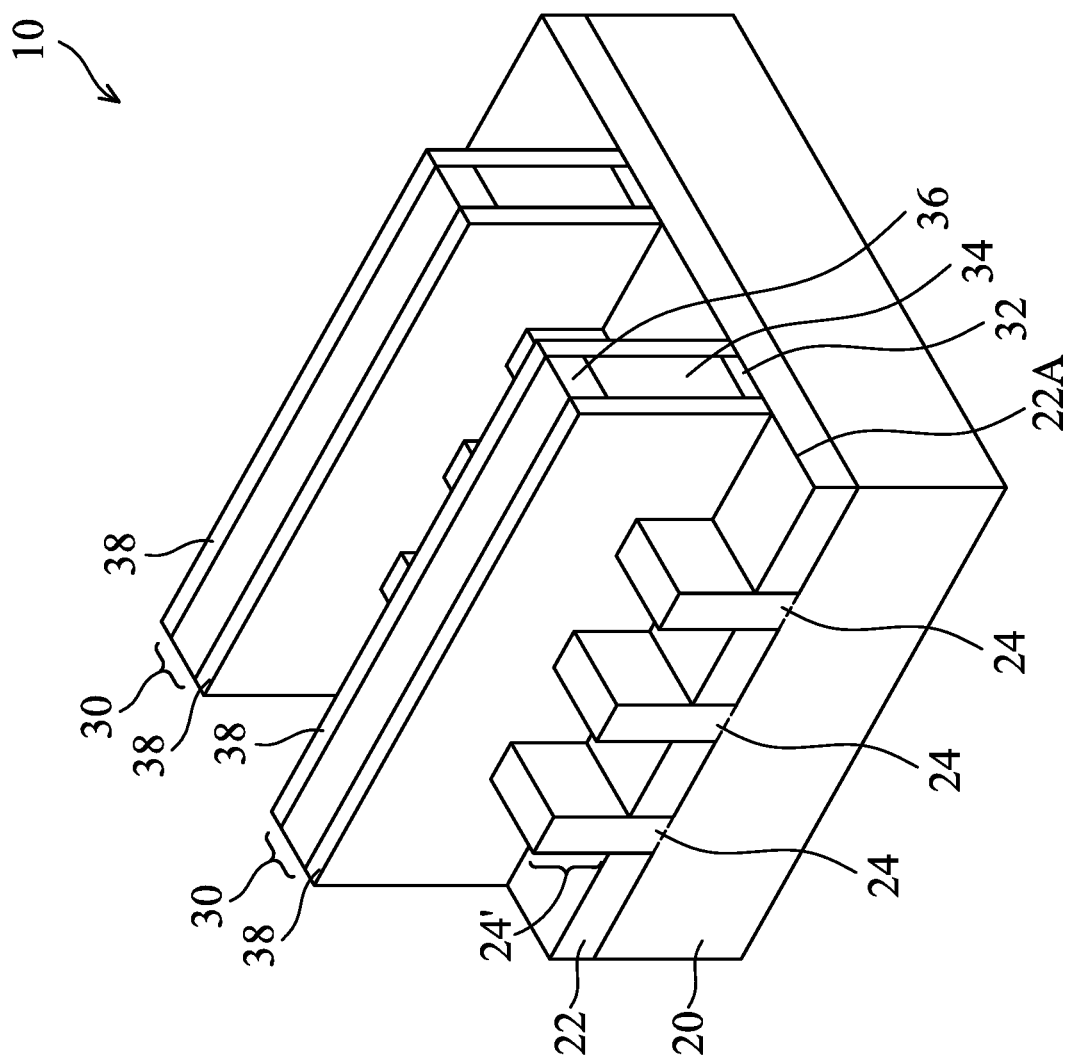

Referring to FIG. 3, dummy gate stack 30 is formed to extend on the top surfaces and the sidewalls of (protruding) fins 24'. The respective process is illustrated as process 204 in the process flow 200 shown in FIG. 21. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon carbo-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 4:
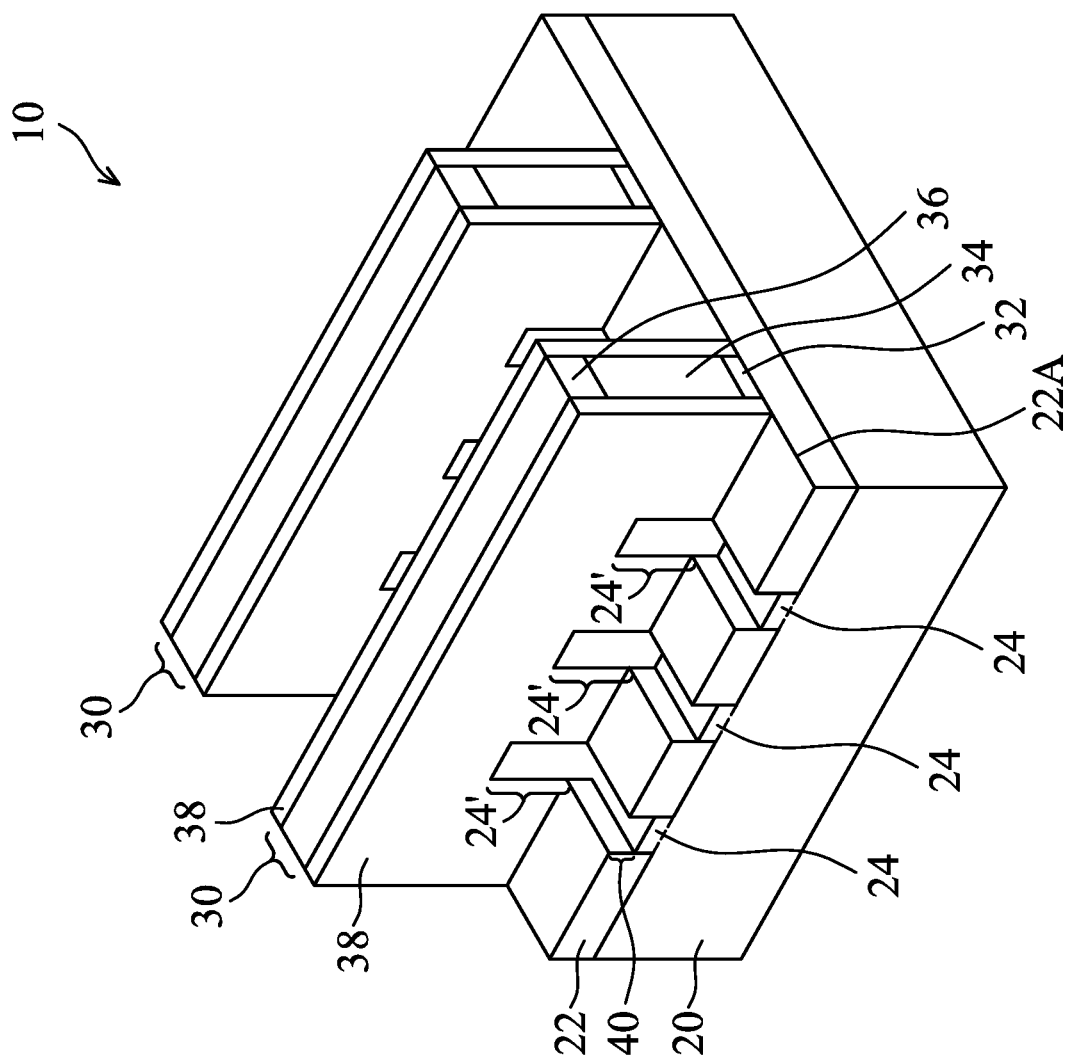

An etching step is then performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are located on the opposite sides of dummy gate stacks 30.

Figure 5A:
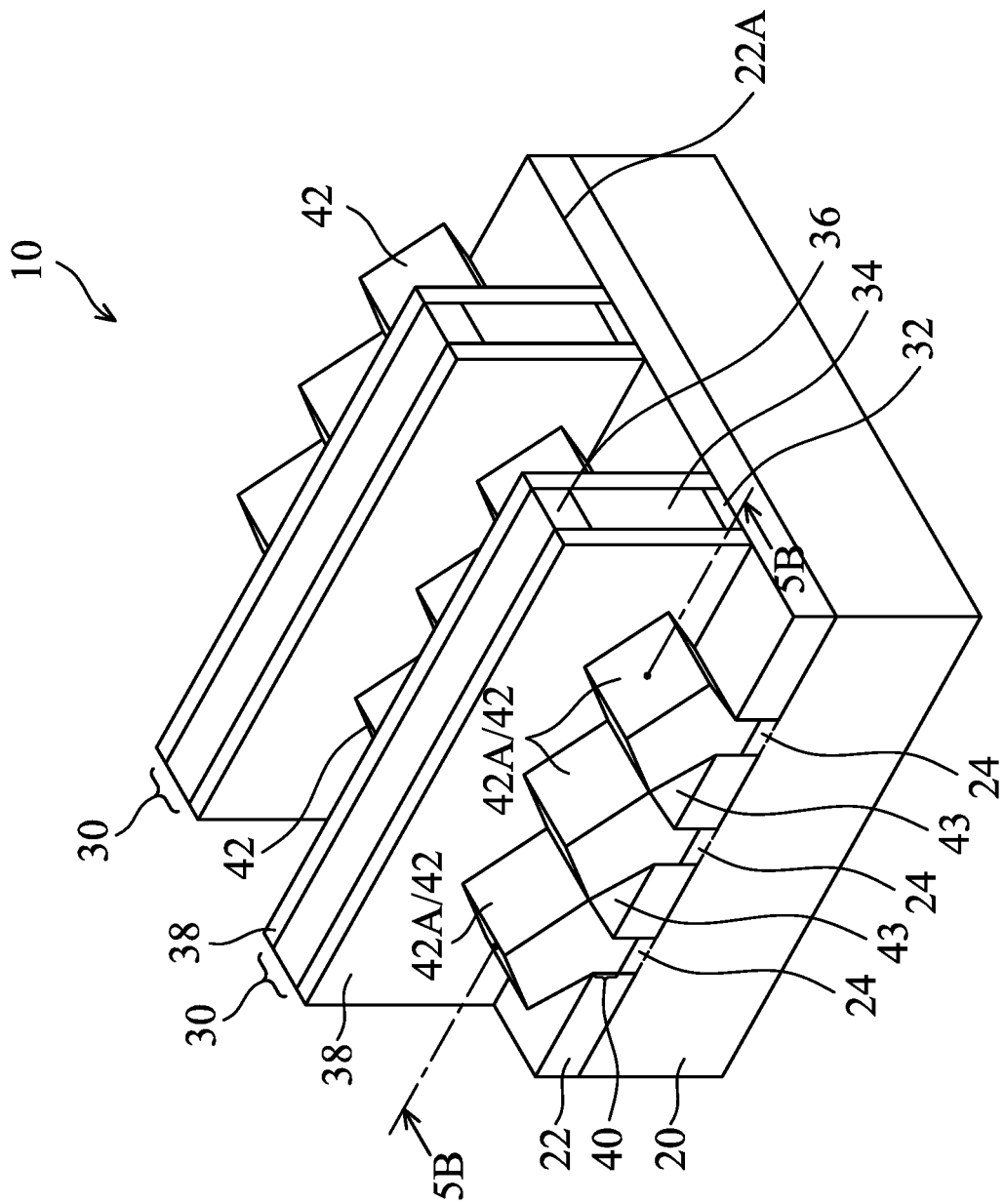

Next, a first epitaxy process is performed to form epitaxy portions 42A, which are selectively grown from recesses 40, resulting in the structure in FIG. 5A. Epitaxy portions 42A may be the lower portions of epitaxy regions 42. The respective process is illustrated as process 206 in the process flow 200 shown in FIG. 21. In accordance with some embodiments, epitaxy portions 42A include silicon germanium or silicon. In accordance with some embodiments of the present disclosure, a p-type impurity such as boron or indium or gallium is in-situ doped into epitaxy portions 42A with the proceeding of the epitaxy. After epitaxy portions 42A fully fill recesses 40, epitaxy portions 42A start expanding horizontally, and facets may be formed. The neighboring epitaxy portions 42A start merging with each other. As a result, an integrated epitaxy region 42A is formed, with the top surface of the integrated epitaxy region 42A being wavy. Epitaxy portions 42A are sometimes referred to as Layer 1 (L1) portions of the epitaxy regions 42.

Figure 17:
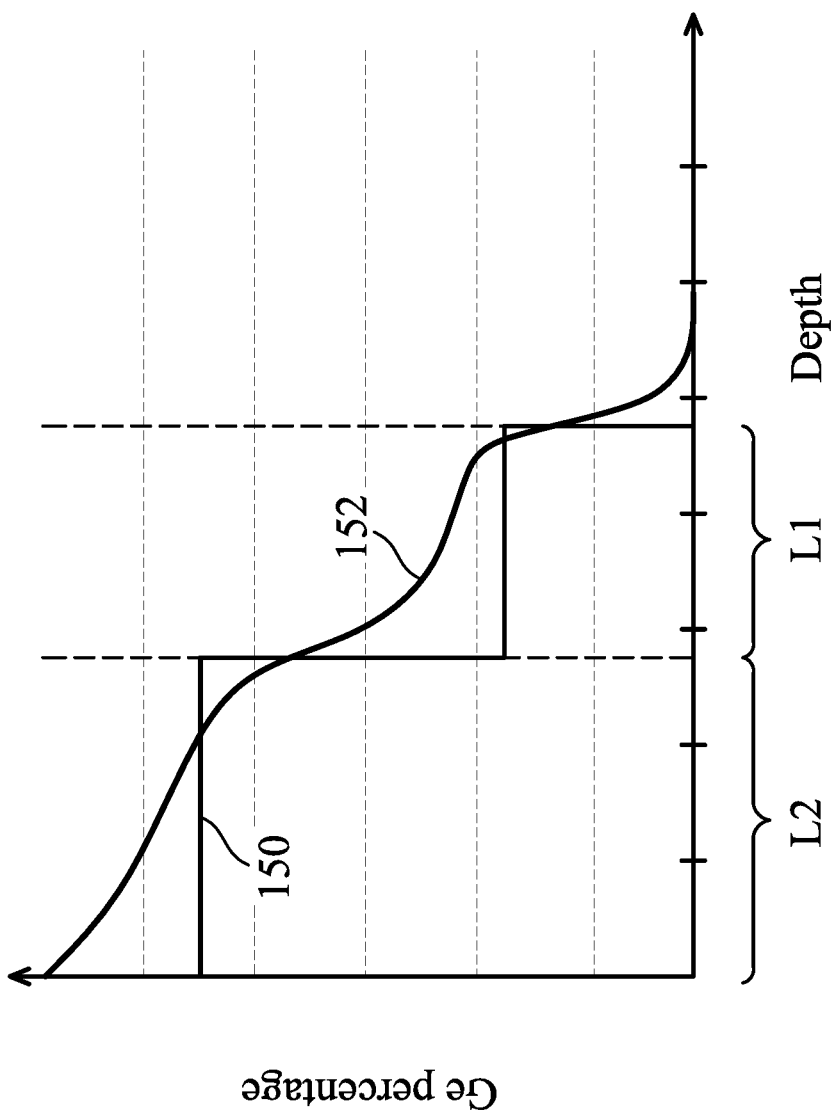
FIG. 17 illustrates the germanium percentages as a function of depths in a silicon germanium region as deposited in accordance with some embodiments.

In accordance with some embodiments of the present disclosure, epitaxy portions 42A comprise silicon germanium with a first germanium atomic percentage, which may be in the range between about 0 percent and about 40 percent. The germanium percentage may be constant from the bottom to the top of epitaxy regions 42A, or may be gradient, which increases gradually. For example, FIG. 17 illustrates an example of the germanium percentages in epitaxy regions 42 as a function of depth of epitaxy regions 42. The depth is shown in FIG. 6B. The X-axis in FIG. 17 represents the depth into epitaxy regions 42, wherein the value of X-axis equal to zero correspond to the top surfaces of epitaxy regions 42 (FIG. 6B). In accordance with some embodiments of the present disclosure, the germanium percentage in epitaxy region 42 (as deposited without going any subsequent anneal) is represented by line 150, which shown that the germanium in L1 (and also L2 as discussed in subsequent paragraphs) has a constant atomic percentage. In accordance with alternatively embodiments of the present disclosure, the germanium percentage in epitaxy region 42 (as deposited without going any subsequent anneal) is represented by line 152, which shows that upper portions of L1 portions of epitaxy regions 42 have gradually increased germanium percentages than the respective lower portions.

Figure 5B:
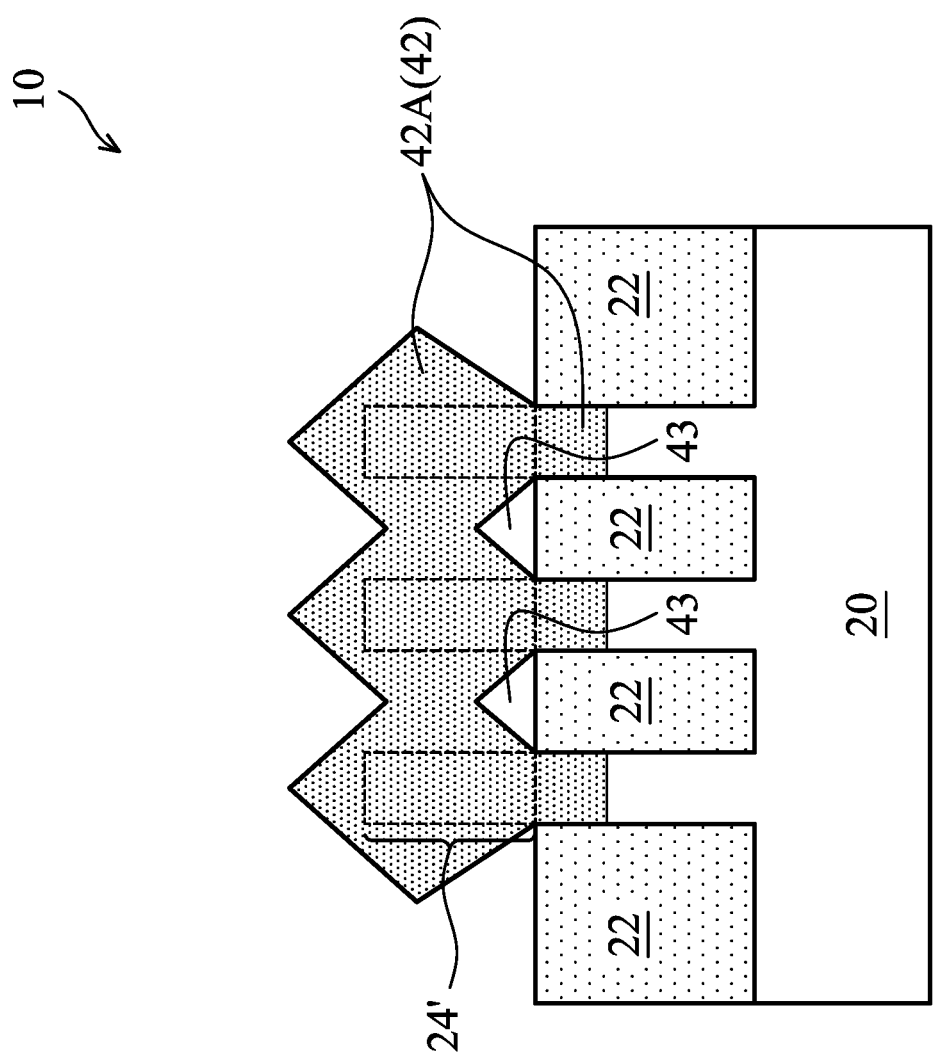

FIG. 5B illustrates a cross-sectional view of the structure shown in FIG. 5A, wherein the cross-sectional view is obtained from the vertical plane containing line 5B-5B in FIG. 5A. In FIG. 5B, the position of protruding fins 24', which is not in the illustrated plane, is shown using dashed lines to illustrate the relative positions of protruding fins 24' and epitaxy portions 42A in accordance with some embodiments.

With the proceeding of the epitaxy, the epitaxy regions 42A grown from neighboring recesses merge with each other to form an integrated epitaxy region 42A. Voids (air gaps) 43 may be generated. In accordance with some embodiments of the present disclosure, the formation of epitaxy region 42A is finished when the top surface of epitaxy region 42A is still wavy. In accordance with other embodiments of the present disclosure, the formation of epitaxy region 42A is finished when the top surface of epitaxy region 42A has become planar.

Figure 6A:
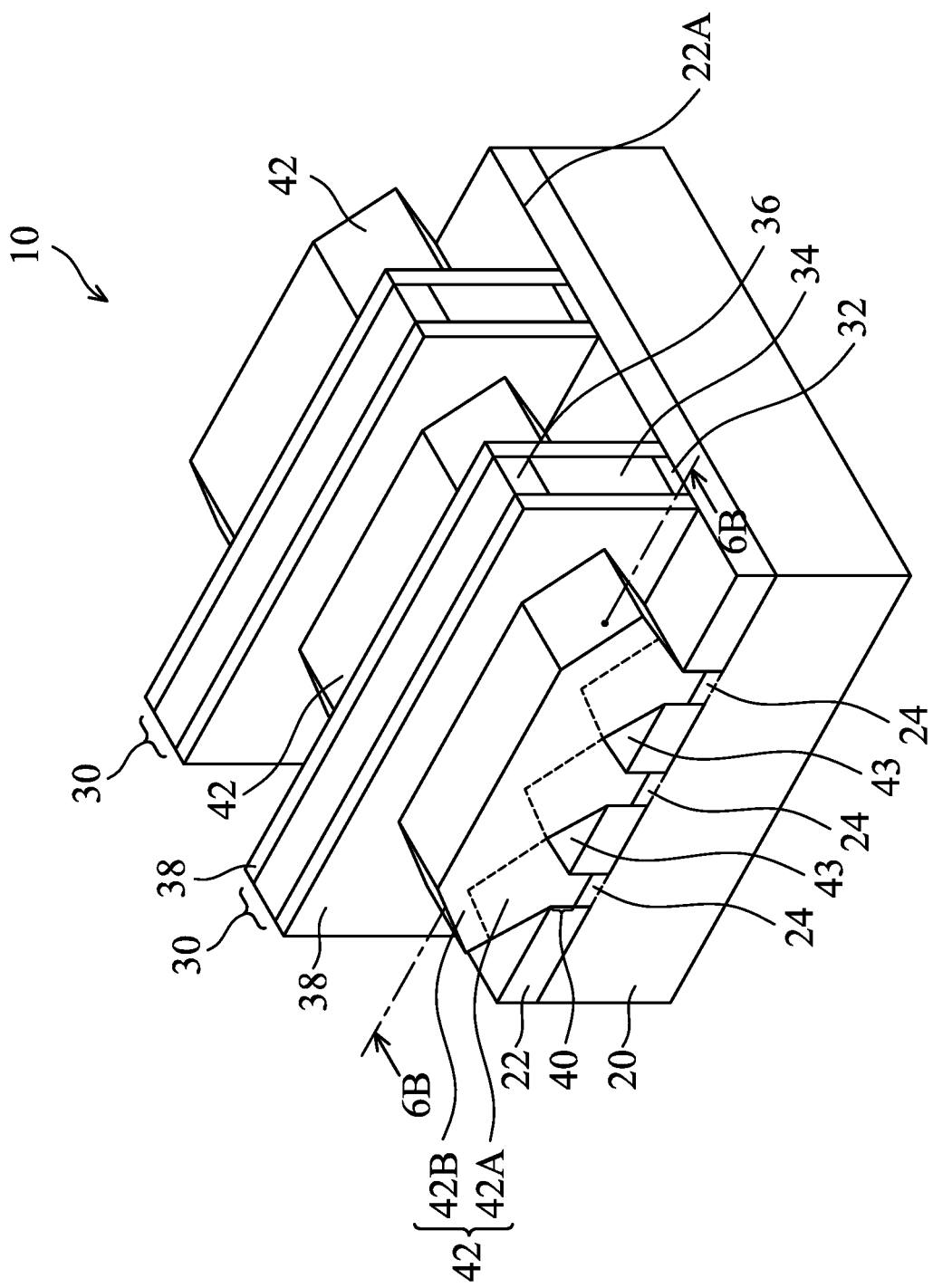
Figure 6B:
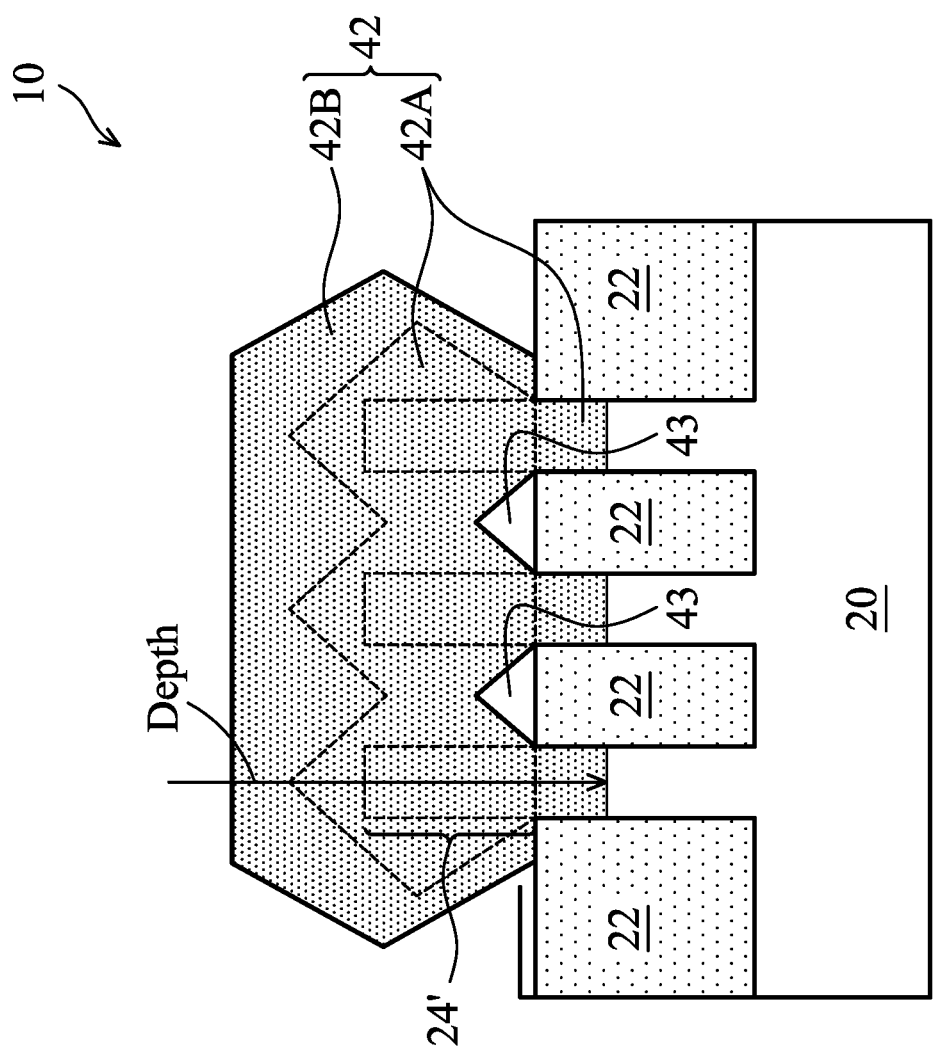

FIG. 6A illustrates the continued growth of epitaxy regions 42. The respective process is illustrated as process 208 in the process flow 200 shown in FIG. 21. Epitaxy regions 42 include upper portions 42B in addition to the lower portions 42A. Epitaxy regions 42B may comprise silicon germanium, and may or may not doped with a p-type impurity such as boron, indium, gallium, or the like during the epitaxy. Upper portions 42B are referred to as the Layer 2 (L2) portions of the epitaxy regions 42. In accordance with some embodiments of the present disclosure, upper portions 42B have a second germanium percentage higher than the first germanium percentage of lower portions 42A. For example, the second germanium percentage may be in the range between about 40 percentage and about 100 percent. The difference between the atomic percentages of upper portions 42B and lower portions 42A may be higher than, for example, about 20 percent. The second germanium percentage may be constant from the bottom to the top of epitaxy regions 42B, or may be gradient, which increases gradually. For example, FIG. 17 illustrates an example of the percentages of epitaxy regions 42B in accordance with some embodiments of the present disclosure, which shows that L2 portions 42B have gradually increased germanium percentages or a constant germanium percentage. The top surfaces of upper portions 42B may be planar as shown in FIG. 6A. Throughout the description, epitaxy regions 42 are alternatively referred to as source/drain regions 42.

FIG. 6B illustrates a cross-sectional view of the structure shown in FIG. 6A, wherein the cross-sectional view is obtained from the vertical plane containing line 6B-6B in FIG. 6A. In FIG. 6B, the positions of protruding fins 24', which are not in the illustrated plane, are shown to illustrate the relative positions of protruding fins 24' and epitaxy portions 42A and 42B in accordance with some embodiments.

Figure 7:
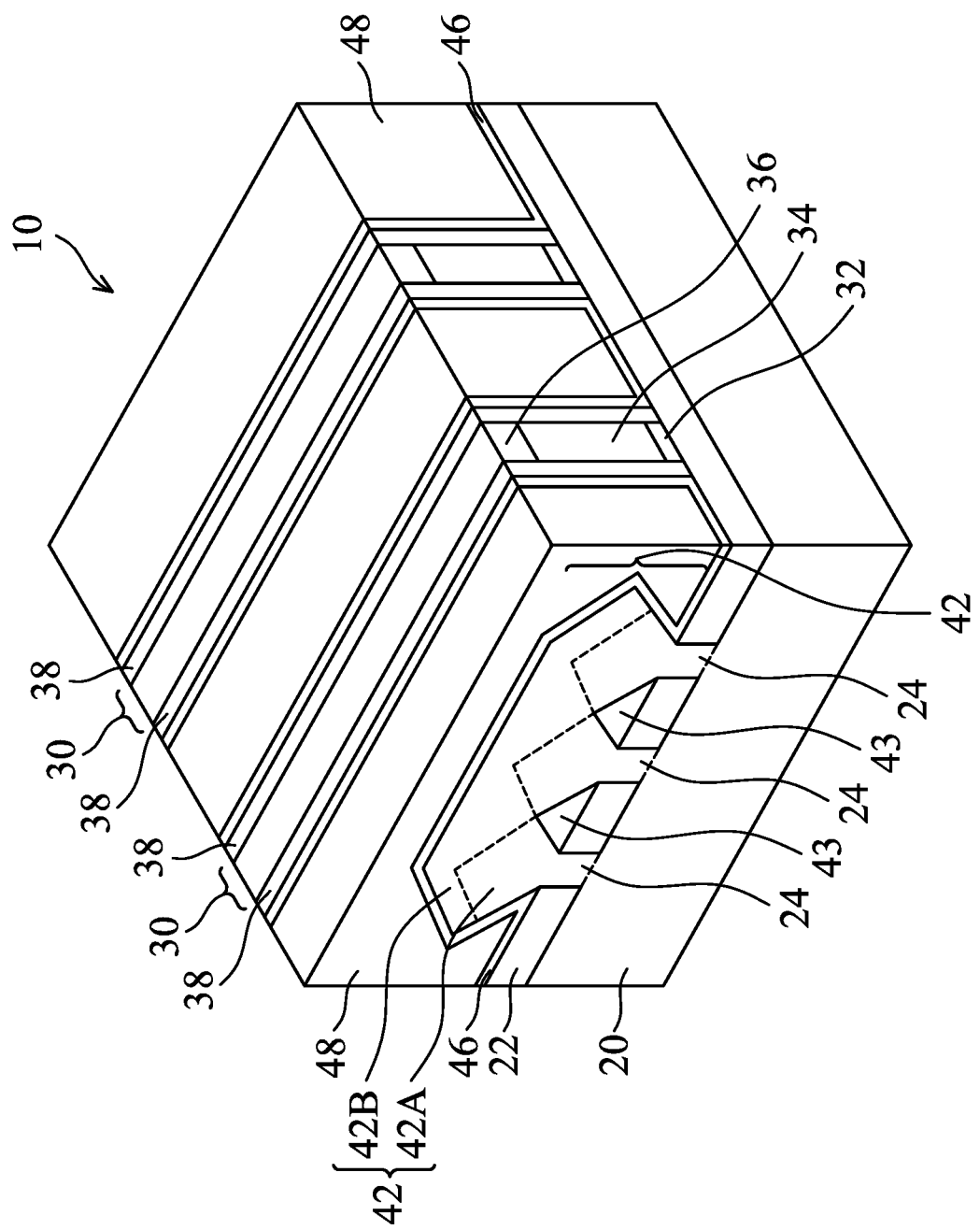

FIG. 7 illustrates a perspective view of the structure after the formation of Contact Etch Stop Layer (CESL) 46 and Inter-Layer Dielectric (ILD) 48. The respective process is illustrated as process 210 in the process flow 200 shown in FIG. 21. CESL 46 may be formed of silicon oxide, silicon nitride, silicon carbo-nitride, or the like, and may be formed using CVD, ALD, or the like. ILD 48 may include a dielectric material formed using, for example, FCVD, spin-on coating, CVD, or another deposition method. ILD 48 may be formed of an oxygen-containing dielectric material, which may be silicon-oxide based such as Tetra Ethyl Ortho Silicate (TEOS) oxide, Plasma-Enhanced CVD (PECVD) oxide (SiO$_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, dummy gate stacks 30, and gate spacers 38 with each other.

Figure 8:
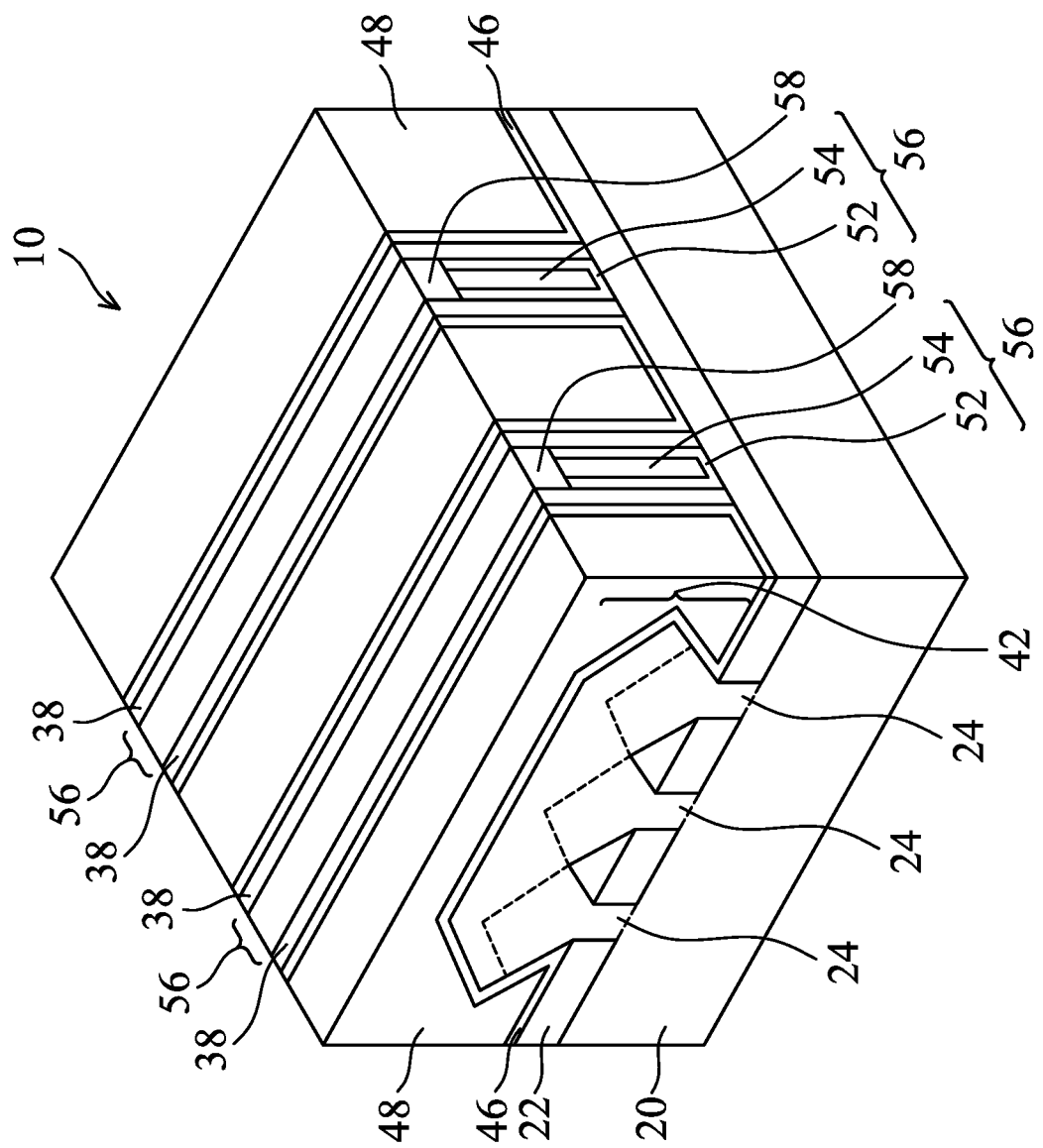

Next, dummy gate stacks 30, which include hard mask layers 36, dummy gate electrodes 34, and dummy gate dielectrics 32, are replaced with replacement gate stacks 56, which include metal gates 54 and gate dielectrics 52 as shown in FIG. 8. When forming replacement gate stacks 56, hard mask layers 36, dummy gate electrodes 34, and dummy gate dielectrics 32 as shown in FIG. 7 are first removed in one or a plurality of etching steps, resulting in trenches/openings to be formed between gate spacers 38. The top surfaces and the sidewalls of protruding semiconductor fins 24' are exposed to the resulting trenches.

Next, (replacement) gate dielectric layers 52 are formed, which extend into the trenches between gate spacers 38. In accordance with some embodiments of the present disclosure, each of gate dielectric layers 52 include an Interfacial Layer (IL) as its lower part, which contacts the exposed surfaces of the corresponding protruding fins 24'. The IL may include an oxide layer such as a silicon oxide layer, which is formed through the thermal oxidation of protruding fins 24', a chemical oxidation process, or a deposition process. Gate dielectric layer 52 may also include a high-k dielectric layer formed over the IL. The high-k dielectric layer may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Referring further to FIG. 8, gate electrodes 54 are formed over gate dielectrics 52, Gate electrodes 54 include conductive sub-layers. The sub-layers are not shown separately, while the sub-layers are distinguishable from each other. The deposition of the sub-layers may be performed using a conformal deposition method(s) such as ALD or CVD.

The stacked conductive layers may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), a barrier layer, which may be another TiN layer, is formed.

The deposited gate dielectric layers and conductive layers are formed as conformal layers extending into the trenches, and include some portions over ILD 48. Next, a metallic material is deposited to fill the remaining trenches between gate spacers 38. The metallic material may be formed of tungsten or cobalt, for example. In a subsequent step, a planarization step such as a CMP process or a mechanical grinding process is performed, so that the portions of the gate dielectric layers, conductive sub-layers, and the metallic material over ILD 48 are removed. As a result, metal gate electrodes 54 and gate dielectrics 52 are formed. Gate electrodes 54 and gate dielectrics 52 are in combination referred to as replacement gate stacks 56. The top surfaces of replacement gate stacks 56, gate spacers 38, CESL 46, and ILD 48 may be substantially coplanar at this time.

FIG. 8 also illustrates the formation of hard masks 58 in accordance with some embodiments. The formation of hard mask 58 may include performing an etching step to recess gate stacks 56, so that recesses are formed between gate spacers 38, filling the recesses with a dielectric material, and then performing a planarization process such as a CMP process or a mechanical grinding process to remove excess portions of the dielectric material. Hard masks 58 may be formed of silicon nitride, silicon oxynitride, silicon oxy-carbo-nitride, or the like.

Figure 9A:
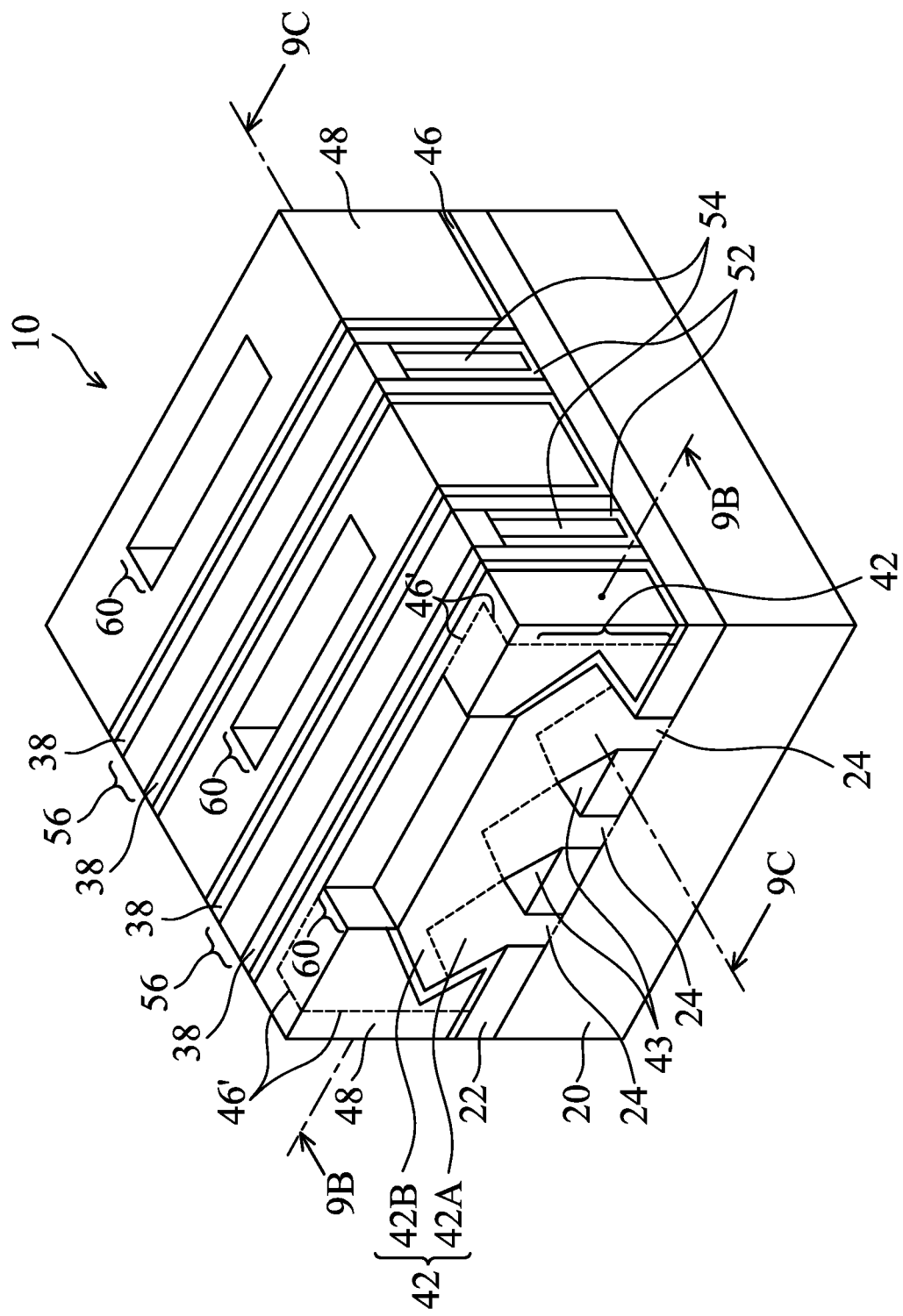

FIG. 9A illustrates the formation of contact openings 60. The respective process is illustrated as process 212 in the process flow 200 shown in FIG. 21. The formation of contact openings 60 include etching ILD 48 to expose the underlying portions of CESL 46, and then etching the exposed portions of CESL 46 to reveal epitaxy regions 42. In accordance with some embodiments of the present disclosure, as shown in FIG. 9A, the length of contact openings 60 is substantially equal to the length of the planar top surface of epitaxy regions 42. In accordance with other embodiments of the present disclosure, contact openings 60 are larger than illustrated, and may expand to the positions marked by dashed lines 46'. As a result, the upper and lower facets of epitaxy regions 42 may be revealed after the corresponding portions of CESL 46 are etched. Also, In accordance with some embodiments of the present disclosure, as illustrated in FIG. 9A, gate spacers 38 are spaced apart from nearest contact openings 60 by some remaining portions of ILD 48. In accordance with other embodiments, the sidewalls of contact openings 60 are exposed to contact openings 60.

Figure 9B:
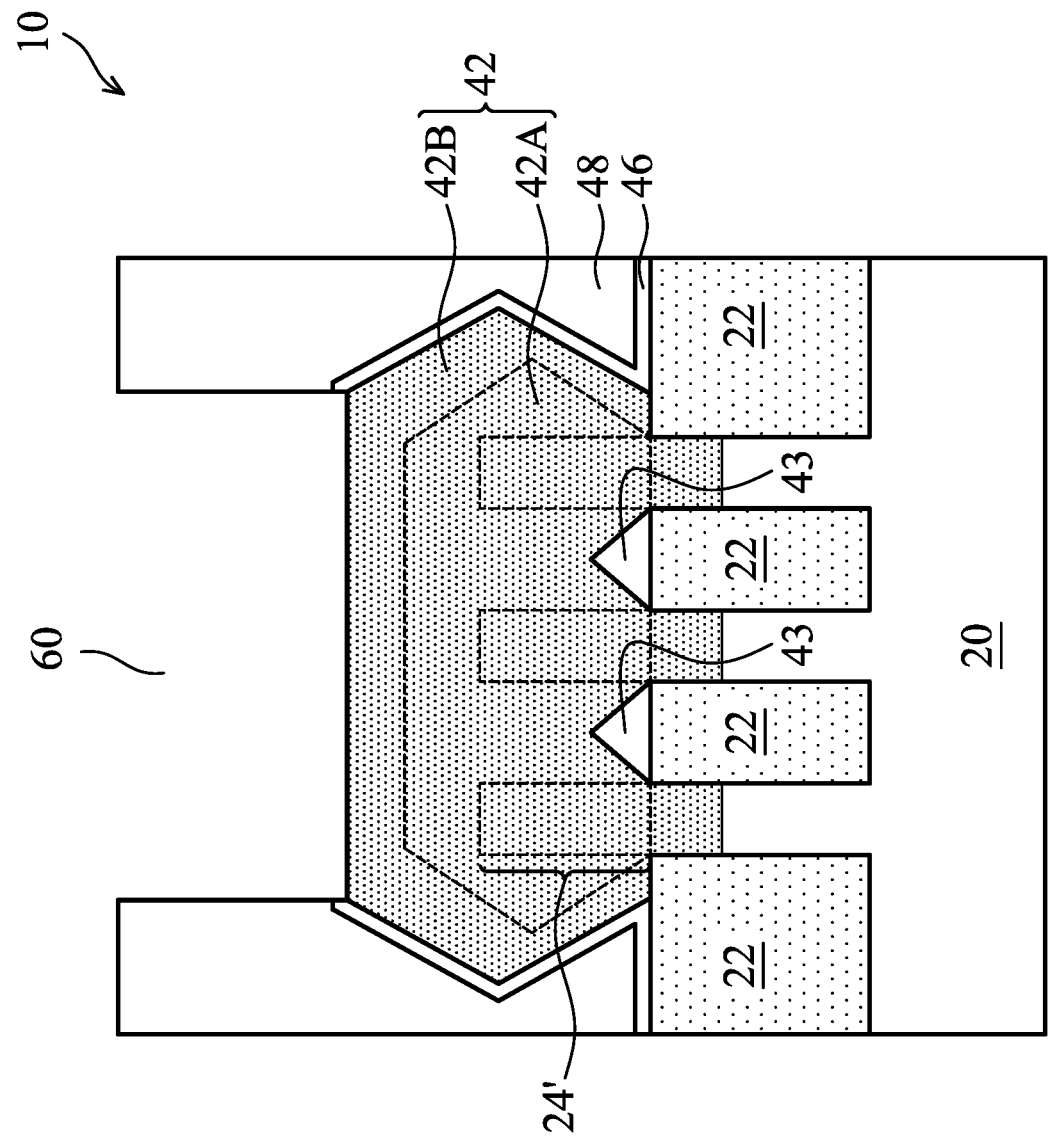
Figure 9C:
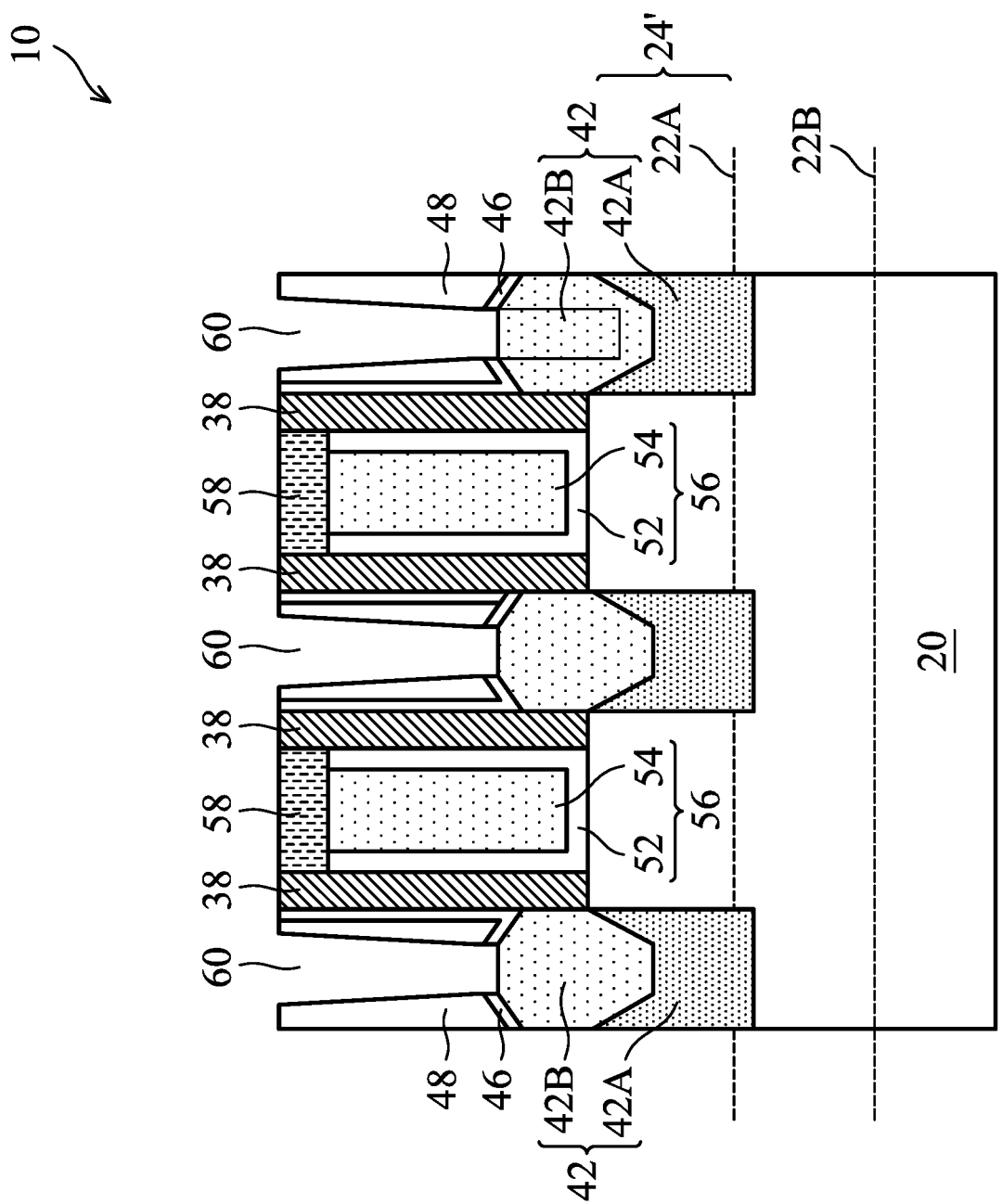

FIG. 9B illustrates a cross-sectional view of contact opening 60 obtained from the vertical plane containing line 9B-9B in FIG. 9A. FIG. 9C illustrates a cross-sectional view of contact opening 60 obtained from the vertical plane containing line 9C-9C in FIG. 9A. In FIG. 9C, the levels of the top surfaces 22A and bottom surfaces 22B of STI regions 22 are illustrated, and semiconductor fins 24' are over top surfaces 22A.

Figure 10:
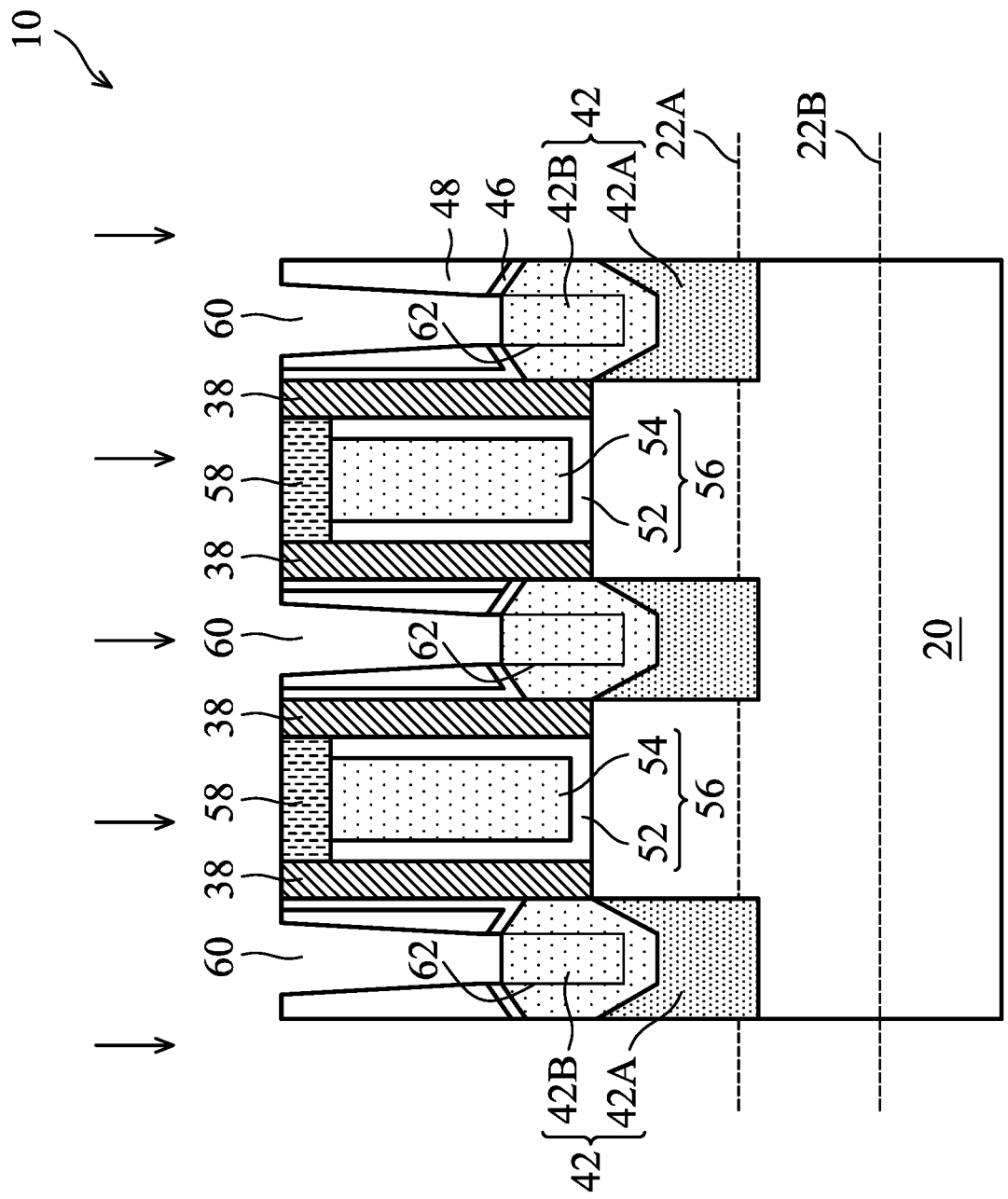

Referring to FIG. 10, a Pre-Amorphization Implantation (PAI, also sometimes referred to as pre-amorphous implantation) is performed for forming PAI regions 62 in epitaxy regions 42. The respective process is illustrated as process 214 in the process flow 200 shown in FIG. 21. In accordance with some embodiments, silicon or germanium is implanted. In accordance with other embodiments, an inert specie such as neon, argon, xenon, and radon is implanted. PAI regions 62 may be in epitaxy portions 42B and do not extend into epitaxy portions 42A. Alternatively, PAI regions 62 may extend slightly into epitaxy portions 42A. Epitaxy portions 42B may or may not include portions that are at a same level as PAI regions 62 and not implanted. The lattice structure of epitaxy portions 42B is destructed by the PAI, and PAI regions 62 are converted into amorphous regions.

Next, a p-type impurity (dopant) implantation is performed. The respective process is also illustrated as process 214 in the process flow 200 shown in FIG. 21. For example, boron, gallium, and/or indium may be implanted.

Figure 11:
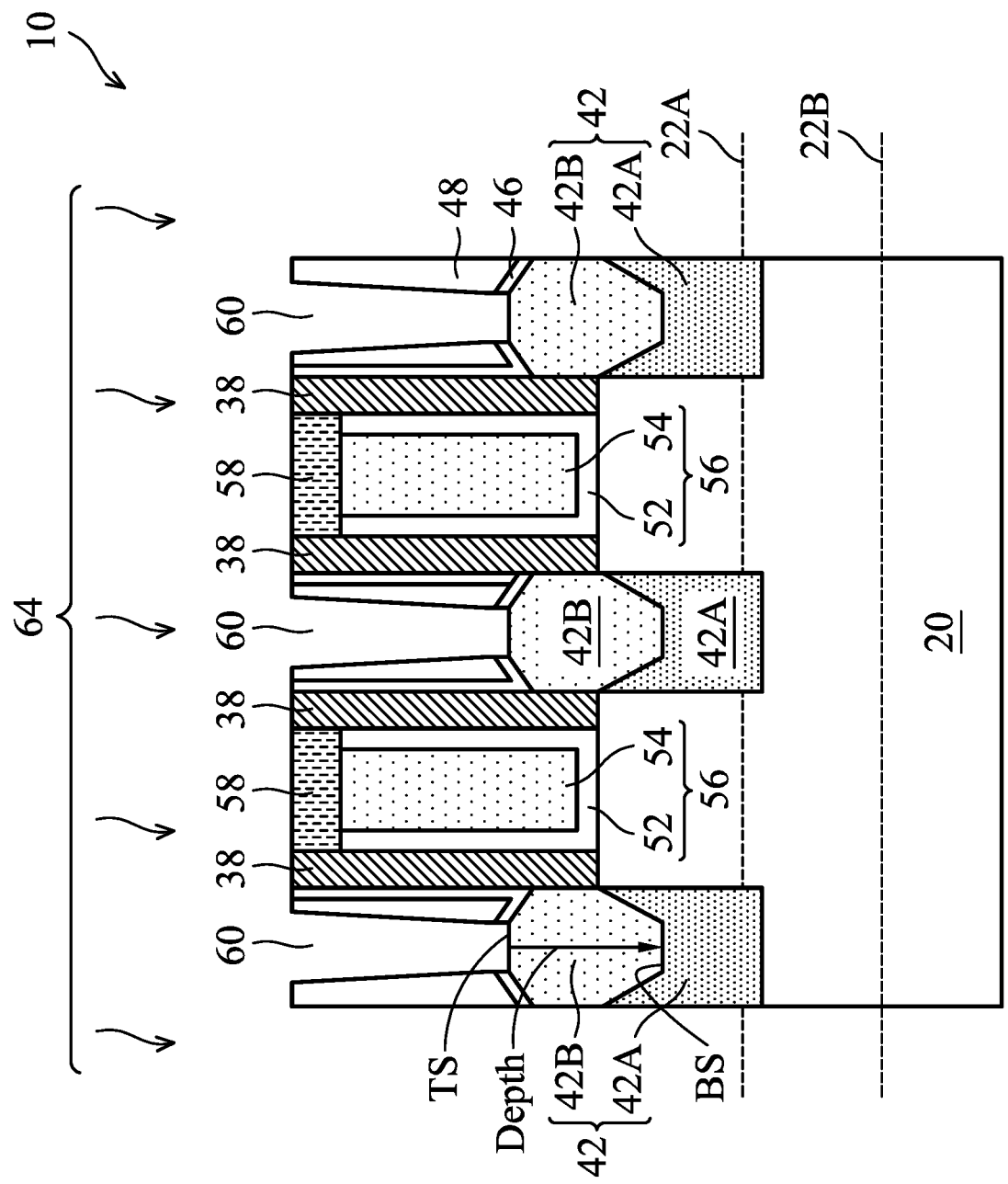

FIG. 11 illustrates the structure after a subsequent anneal process, as represented by arrows 64. The respective process is illustrated as process 216 in the process flow 200 shown in FIG. 21. In accordance with some embodiments, the anneal process includes a melt anneal process. In the melt anneal process, at least a portion of epitaxy regions 42 is molten. The anneal process, in addition to the melt process, may or may not include other non-melt anneal processes such as, and not limited to, a millisecond anneal process, which may be performed using laser, UV light, flash lamp, etc. In the non-melt anneal processes, no portion of epitaxy regions 42 is molten. The non-melt anneal processes have the effect of activating the dopants in non-melted portions of the source/drain regions in addition to the molten portions of the source/drain regions. Through the melt anneal process, the PAI regions 62 are re-crystallized.

In accordance with some embodiments of the present disclosure, the melt anneal is performed through laser anneal, wherein a laser beam is projected on the portions of wafer 10 to be annealed. In accordance with alternative embodiments of the present disclosure, a UV beam is used for the melt anneal. When a laser beam is used, the laser beam may have the size of one die or a plurality of dies, or may have the size of an entire wafer, and a laser pulse is generated so that the entire die, the plurality of dies, or the entire wafer is annealed simultaneously. The size of the laser beam may also be a fraction (such as a quarter, a third, a half, etc.) of a device die. In which case, a device die is annealed through several laser pulses that in combination cover the entire die. The duration of the laser beam may be in the range between about 10 nanoseconds and about 1 microsecond. The laser beam may also be small, and the laser anneal is performed by scanning the wafer using the laser beam. In accordance with some embodiments of the present disclosure, the laser source has polarization function to generate a polarized light source (with the corresponding electrical field either parallel to or perpendicular to the incident plane of the laser beam). The laser source may also have pre-heat function to raise the temperature of the annealed source/drain regions from room temperature to a sub-melt temperature (for example, about 1,000° C.). The pre-heating is performed proceeding to melting the source/drain regions. The pre-heating can also be performed by annealing the wafers using the laser beam projected through a plurality of projections, each in an incident angle different from other incident angles of the plurality of projections, so that the energy and the resulting melting depths and region can be controlled.

In accordance with some embodiments of the present disclosure, the power and the duration of the melt anneal is adjusted, so that upper portions 42B of epitaxy regions 42 are molten, and the lower portions 42A are not molten. Since there may be voids 43 (FIG. 9B), if lower portions 42A are molten, epitaxy regions 42 may undesirably collapse into voids 43, and hence it is desirable that at least a part of the lower portions 42A is not molten.

The melting point of silicon germanium is related to the atomic percentage of germanium in epitaxy regions 42, and the higher the germanium percentage is, the lower the melting point will be. For example, silicon has the melting point of 1,415° C., and germanium has the melting point of 937° C. The melting point of silicon germanium may be in the range between 937° C. and 1,415° C., depending on the atomic percentage of germanium. Since lower portions 42A have a lower germanium percentage, their melting point is higher than the melting point of upper portions 42B. Therefore, by adjusting the power and laser duration, the temperature of the annealed portions may be selected to be higher than the melting point of upper portions 42B and lower than the melting point of lower portions 42A to cause upper portions 42B to be molten, while lower portions 42A are not molten.

In addition, the amorphized regions 62 have a lower melting point than that of the un-amorphized portions of upper portions 42B. The melt anneal may thus be controlled so that the temperature is higher than the melting point of PAI regions 62 and lower than the melting point of the un-amorphized portions of upper portions 42B, so that PAI regions 62 are molten, while the un-amorphized portions of upper portions 42B and the lower portions 42A are not molten.

In accordance with some embodiments of the present disclosure in which no voids are formed in epitaxy regions 42, the power and the anneal duration are adjusted, so that the temperature of the anneal portions are lower than the melting point of silicon and higher than the melting point of the entire epitaxy regions 42. Accordingly, an entirety of epitaxy regions 42 is molten in the melt anneal. Furthermore, the epitaxy (source/drain) regions of p-type FinFETs and n-type FinFETs may be annealed simultaneously. However, in the melt anneal, the epitaxy (source/drain) regions of p-type FinFETs are molten, and the epitaxy (source/drain) regions of n-type FinFETs may be controlled not to melt since the epitaxy (source/drain) regions of n-type FinFETs have a higher melting point.

Figure 12:
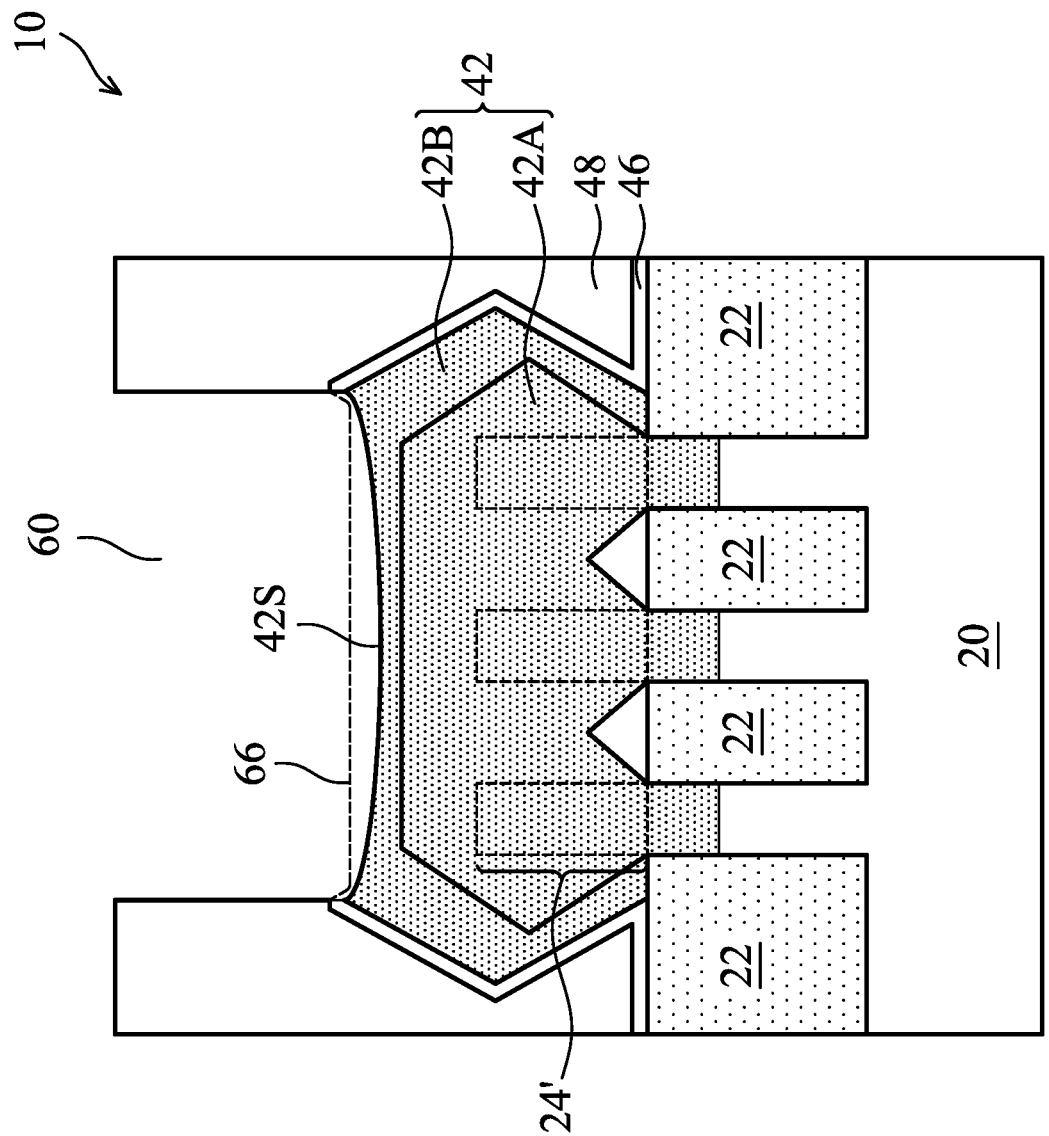

As a result of the melt anneal, germanium will be redistributed in the molten portions and nearby portions of epitaxy regions 42, and will be concentrated to the top surfaces of the molted portions after the subsequent solidification. Also, the wafer 10 as shown in FIG. 11 may go through a plurality of processes including, and not limited to, cleaning processes after the formation of contact openings 60. The respective process is illustrated as process 218 in the process flow 200 shown in FIG. 21. FIG. 12 illustrates the top surface profile of epitaxy regions 42 after the melt anneal and the cleaning processes. Due to the concentration of germanium to the surface of epitaxy regions 42, the surface portions of epitaxy regions 42 are more prone to the oxidation due to the oxygen in air and the oxidant in the chemicals of the cleaning processes. As a result, the top surface 42S of epitaxy region 42 is recessed, and is continuously curved and continuously rounded.

FIG. 12 also illustrates a top surface of epitaxy region 42 using dashed line 66, and dashed line 66 illustrates the top surface profile of epitaxy region 42 when the anneal does not include any melt anneal. Dashed surface 66 has a planar portion connected to opposite slanted and straight portions. As a comparison, surface 42S is continuously curved. Accordingly, the melt anneal results in the surface of epitaxy region 42 to be more curved than non-melt anneals, and the surface area to be increased than if non-melt anneals are used. In the illustrated cross-sectional view, a lowest point of the curved surface 42S may be at the middle of curved surface 42S.

Figure 13:
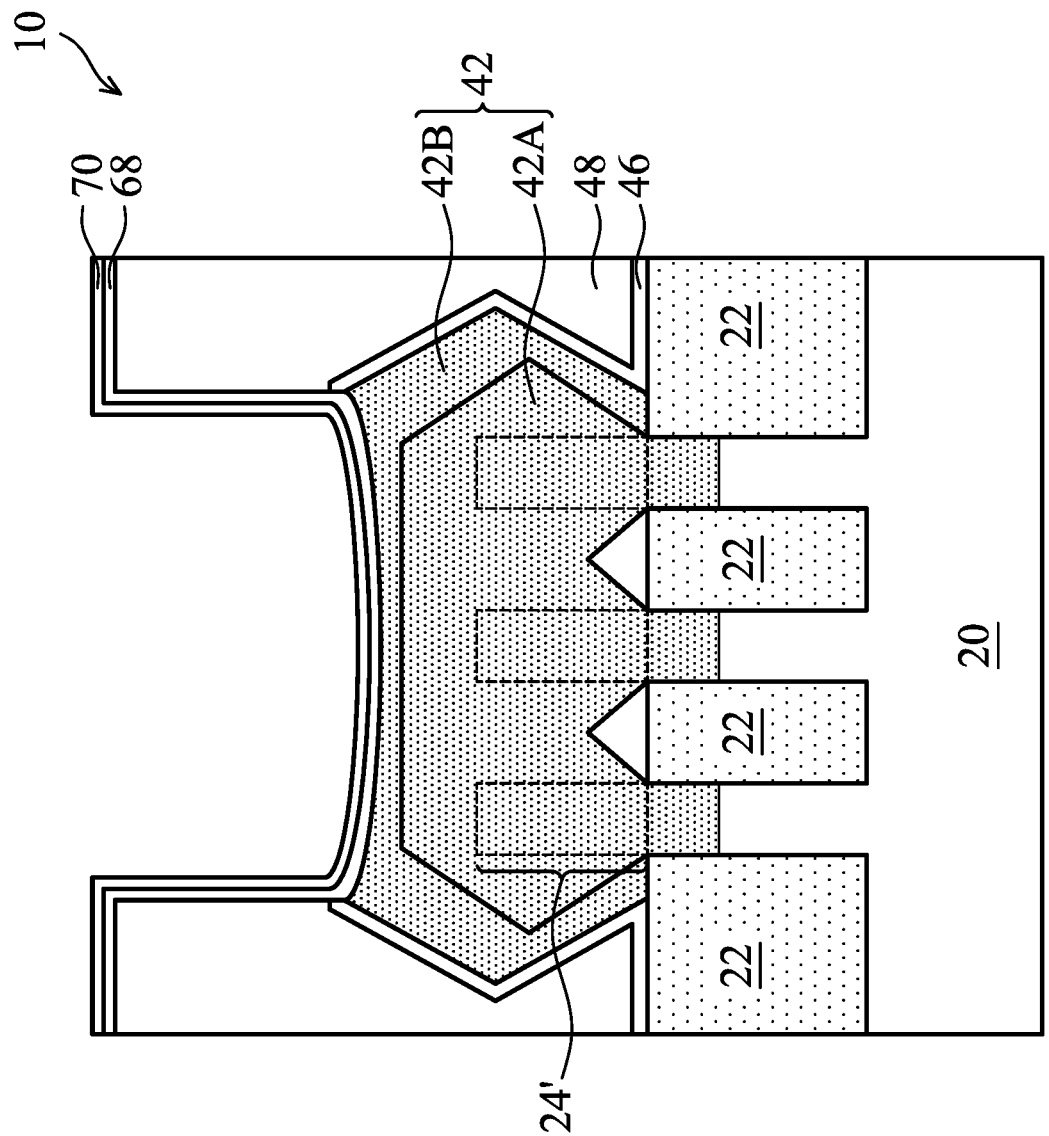

Referring to FIG. 13, metal layer 68 and metal nitride layer 70 are deposited, for example, using conformal deposition processes. The respective process is illustrated as process 220 in the process flow 200 shown in FIG. 21. In accordance with some embodiments, metal layer 68 is a titanium layer. Metal nitride layer 70 may be a titanium nitride layer, and may be formed using ALD, CVD, or the like. Metal nitride layer 70 may also be formed by nitridating the top portion of metal layer 68, and leaving the bottom portion of metal layer 68 not nitridated.

Figure 14A:
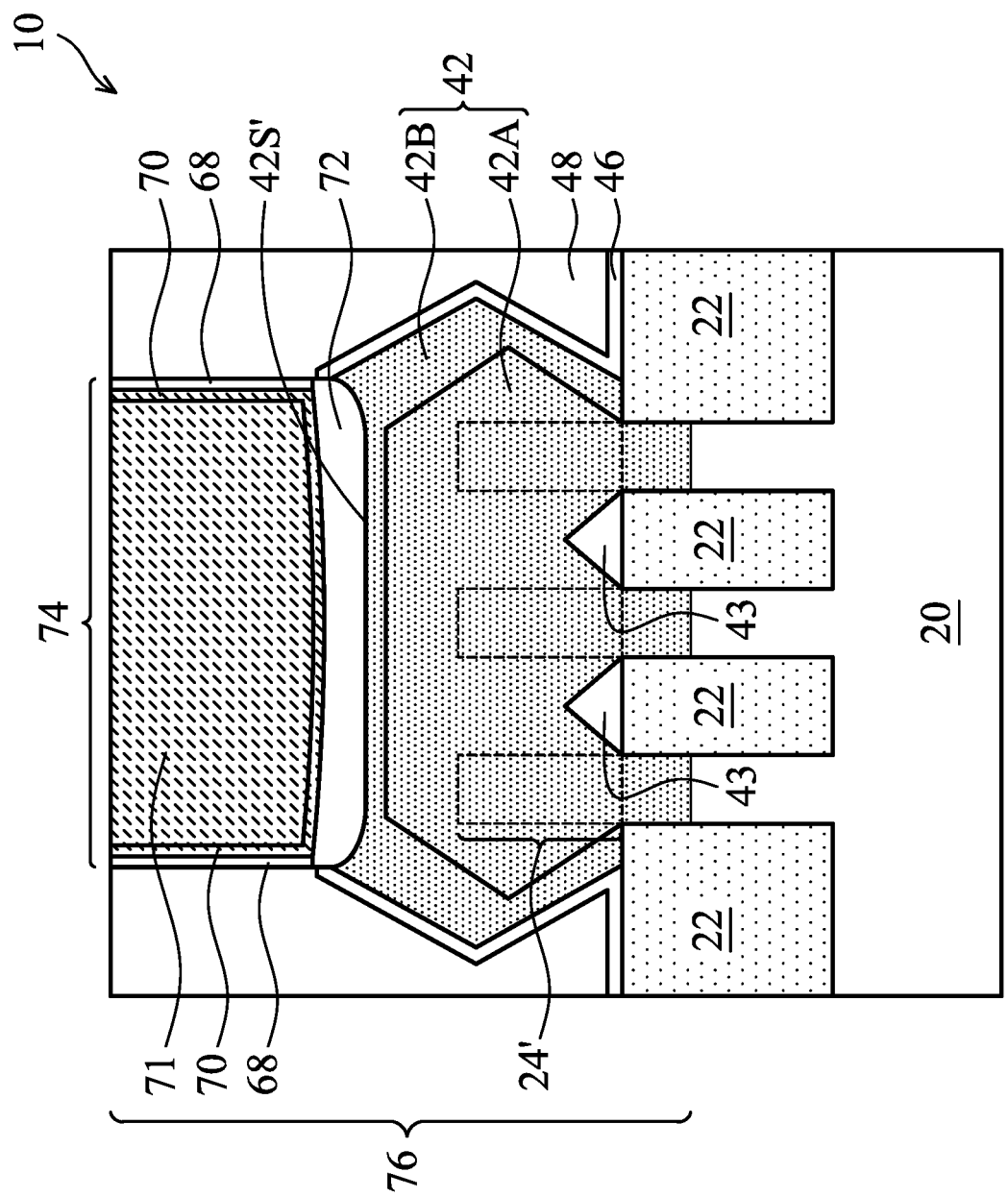

Next, an anneal (which may be rapid thermal anneal) is performed to react metal layer 68 with the top portion of source/drain regions 42 to form silicide region 72, as shown in FIG. 14A. Silicide region 72 forms curved top surface 42S' with the underlying source/drain region 42. The respective process is illustrated as process 222 in the process flow 200 shown in FIG. 21. The portions of metal layer 68 on the sidewalls of ILD 48 are not reacted. Next, either the previously formed metal nitride layer 70 is left as not removed, or the previously formed metal nitride layer 70 is removed, followed by the deposition of a new metal nitride layer (such as titanium nitride layer) that is thinner than the removed metal nitride layer. A metallic material 71 such as tungsten, cobalt, or the like, is then filled into contact openings 60, followed by a planarization to remove excess materials, resulting in source/drain contact plug 74. Accordingly, source/drain contact plug 74 includes the remaining portions of metal layer 68, metal nitride layer 70, and metallic material 71. As a result of the curved top surface of source/drain region 42, the interface between silicide region 72 and source/drain region 42 is curved, resulting in an increased interface area. The source/drain contact resistance is thus reduced. FinFET 76 is thus formed.

Figure 14B:
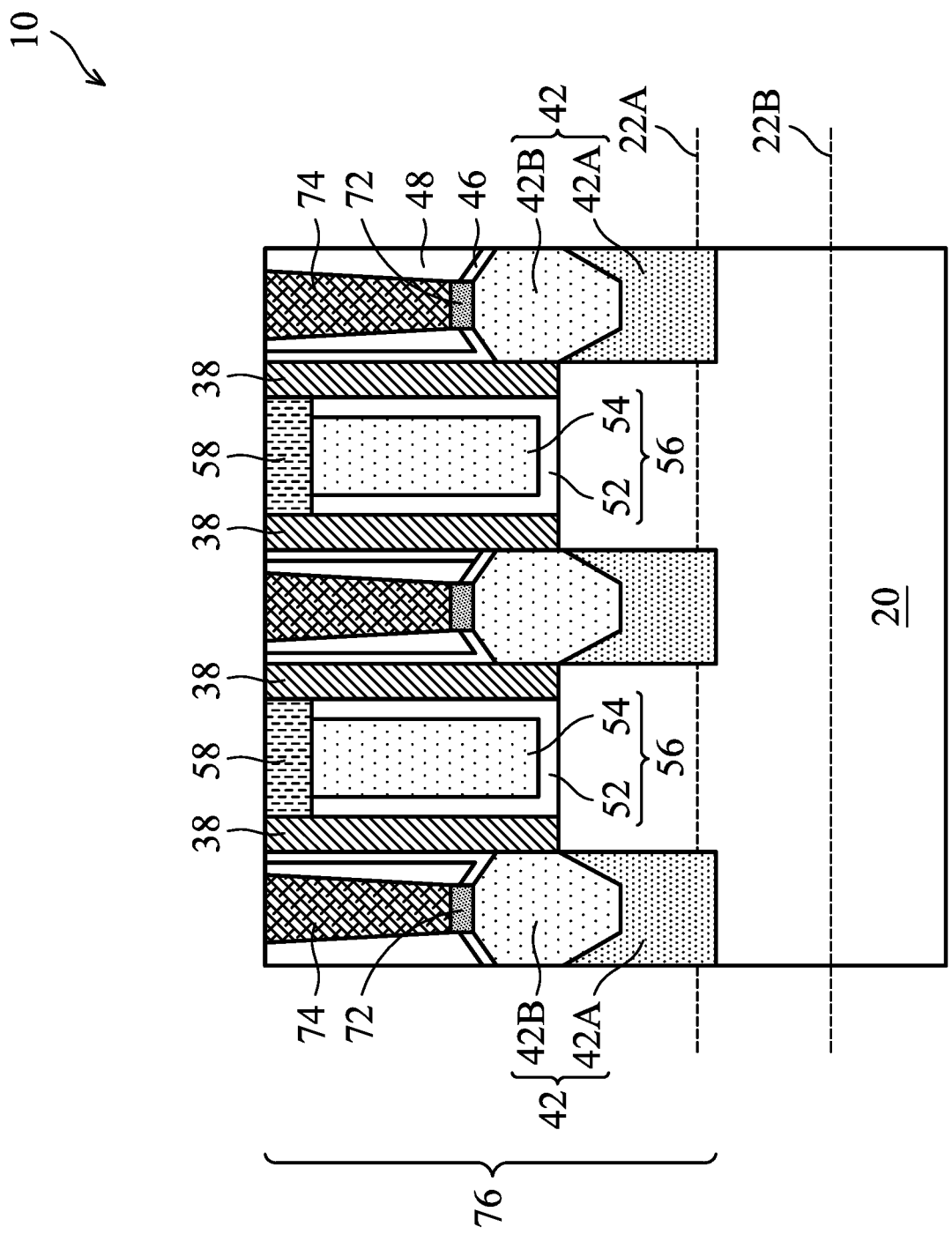
Figure 14C:
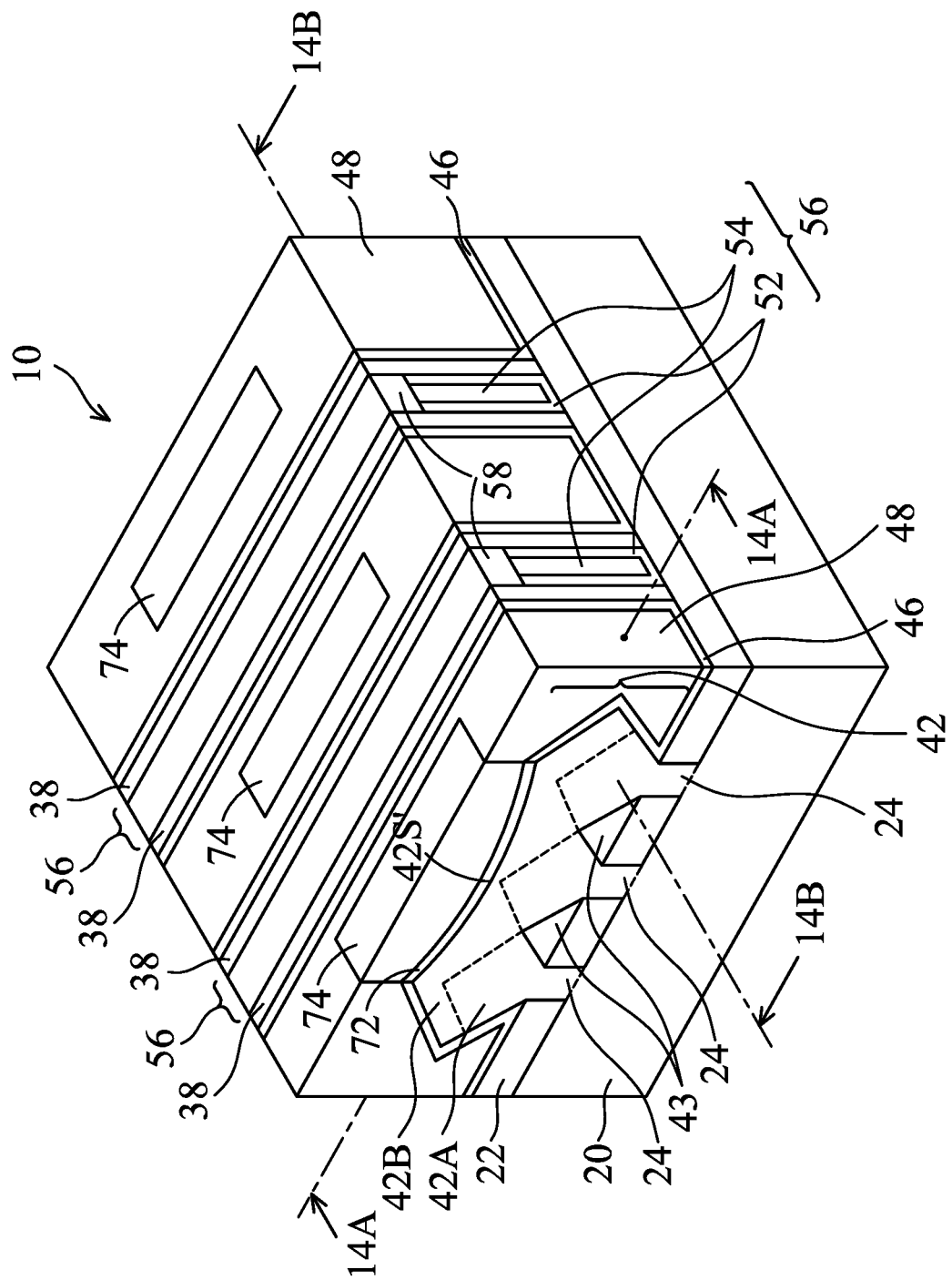

FIGS. 14B and 14C show a cross-sectional view and a perspective view of FinFET 76. The cross-sectional view shown in FIG. 14A is obtained from the vertical plane containing line 14A-14A in FIG. 14C. The cross-sectional view shown in FIG. 14B is obtained from the vertical plane containing line 14B-14B in FIG. 14C.

Figure 15:
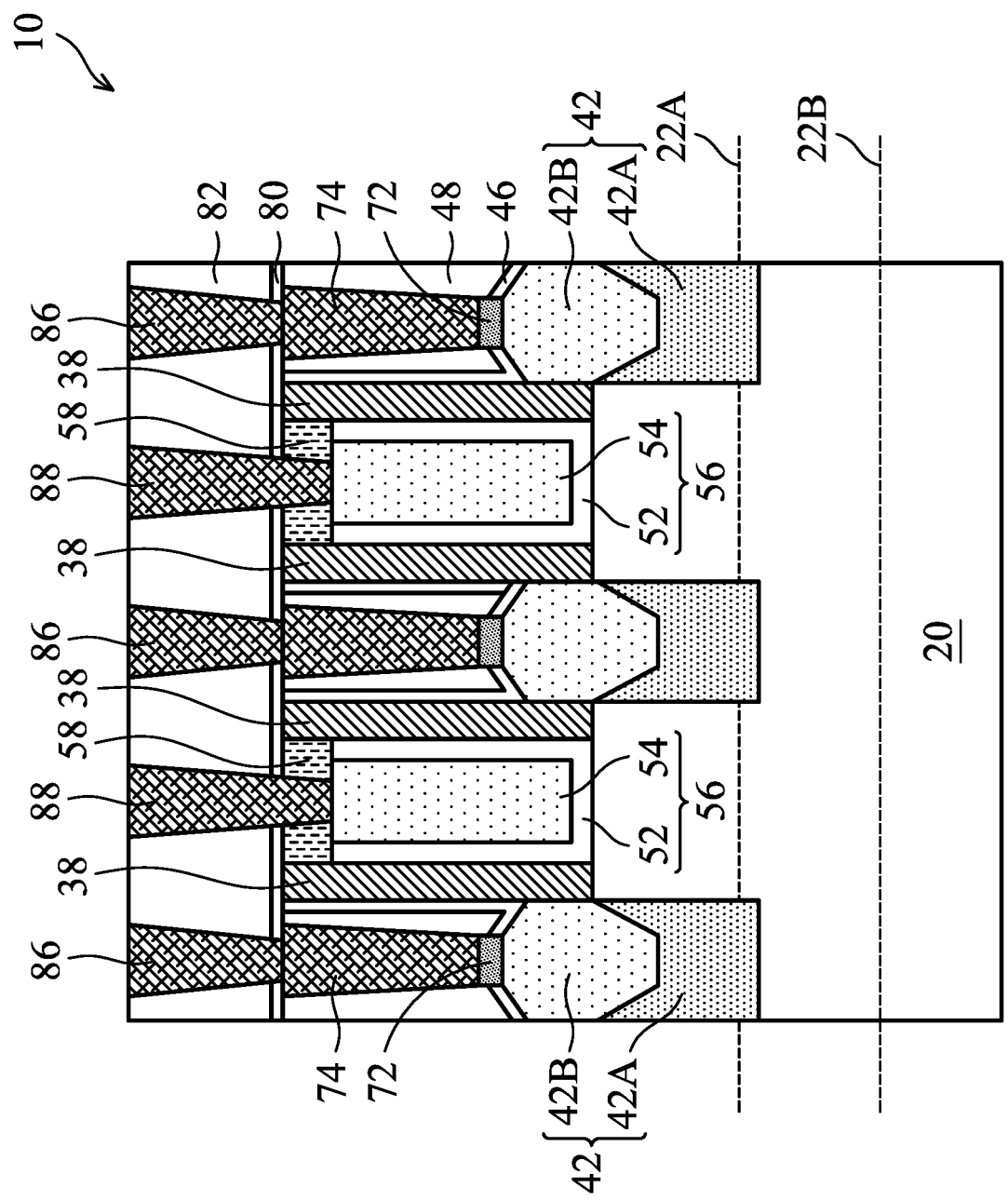

Referring to FIG. 15, in accordance with some embodiments of the present disclosure, etch stop layer 80 is formed. Etch stop layer 80 may be formed of SiN, SiCN, SiC, SiOCN, or another dielectric material. The formation method may include PECVD, ALD, CVD, or the like. Next, ILD 82 is formed over etch stop layer 80. The material of ILD 82 may be selected from the same candidate materials (and methods) for forming ILD 48. In accordance with some embodiments, ILD 82 is formed using PECVD, FCVD, spin-on coating, or the like.

ILD 82 and etch stop layer 80 are etched to form openings. The etching may be performed using, for example, Reactive Ion Etch (RIE). In a subsequent step, source/drain contact plugs 86 and gate contact plugs 88 are formed. In accordance with some embodiments of the present disclosure, contact plugs 86 and 88 include barrier layers and a metal-containing material over the corresponding barrier layers.

As discussed in preceding paragraphs, germanium is concentrated to the top surface of source/drain regions. FIGS. 16A, 16B, 16C, and 16D are shown schematically to explain the mechanism of the germanium concentration. In each of FIGS. 16A, 16B, 16C, and 16D, the X-axis represents the vertical positions in epitaxy regions 42, and the Y-axis represents the normalized values of the germanium atomic percentage. FIGS. 16A, 16B, 16C, and 16D show the germanium percentages as a function of the depths into molten portion. Positions TS and BS represent the top surface and the bottom surface, respectively, of the molten portion of epitaxy region. For example, referring to FIG. 11, assuming portions 42A are not molten, and portions 42B are molten, positions TS and BS are as marked in FIG. 11.

Figure 16B:
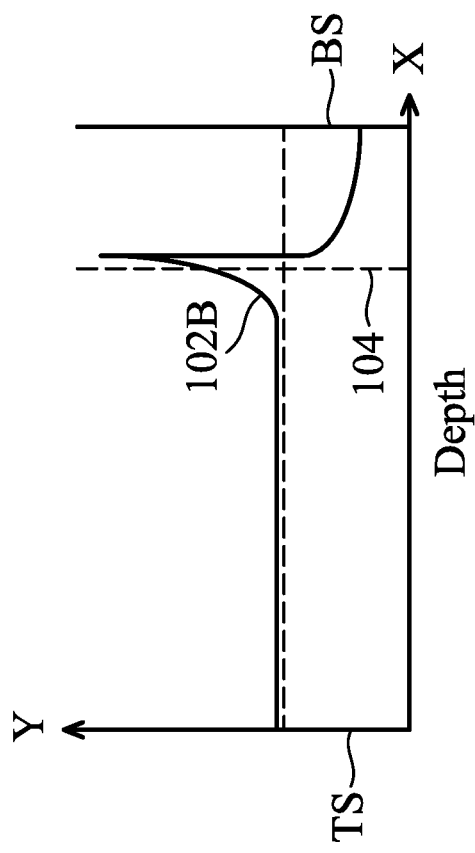
FIGS. 16A, 16B, 16C, and 16D illustrate a sequence of the solidification of a molten silicon germanium region in accordance with some embodiments.
Figure 16D:
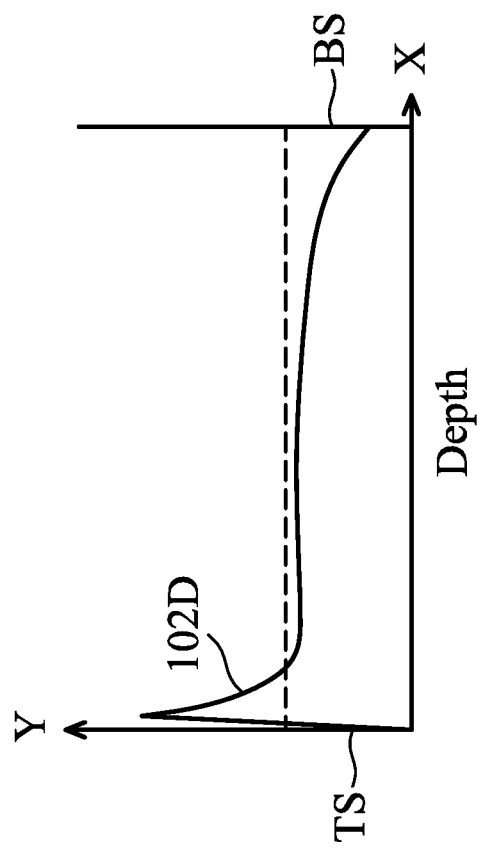
Figure 16A:
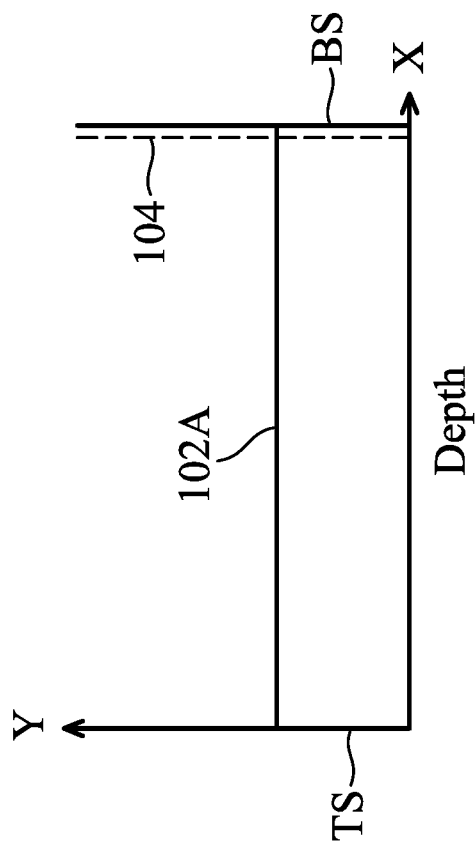
Figure 16C:
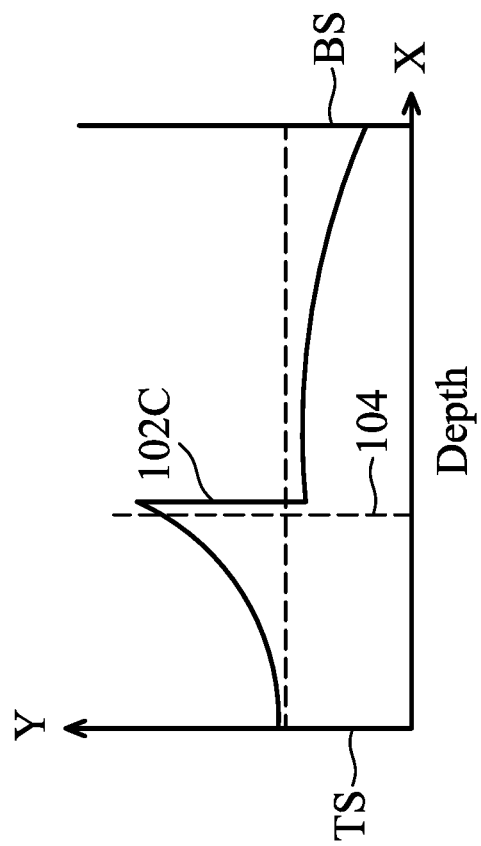

FIGS. 16A, 16B, 16C, and 16D illustrate the change of germanium percentage during the solidification process that occurs after the melt anneal. Referring to FIG. 16A, the entire molten portion is in liquid phase, which has not solidified yet. The molten portion is assumed to have a uniform germanium concentration, as indicated by line 102A. After the melt anneal, solidification starts from bottom surface BS and propagates to top surface TS. Lines 104 (FIGS. 16B, 16C, and 16D) represent the interface between the molten portion and the solid portion. Lines 102B, 102C, and 102D in FIGS. 16A, 16B, and 16C, respectively, represent the corresponding germanium percentages as a function of depth. Germanium tends to be drawn from the surface portion of the solidified silicon germanium into the liquid portions. Accordingly, in the surface portions of the silicon germanium region that has just been solidified, there is a peak of germanium percentage. The germanium in the peaked portion will diffuse into the nearest liquid phased portion, causing the peak to move to the top surface with the proceeding of the solidification. With the proceeding of the solidification, the interface 104 between the molten portion and the un-molten portion gradually moves from position BS to position TS, as indicated in FIGS. 16B, 16C, and 16D. Correspondingly, germanium is diffused from BS to TS gradually, resulting in the peak of germanium at a position close to TS when all molten portion is solidified, as shown in FIG. 16D.

Figure 18:
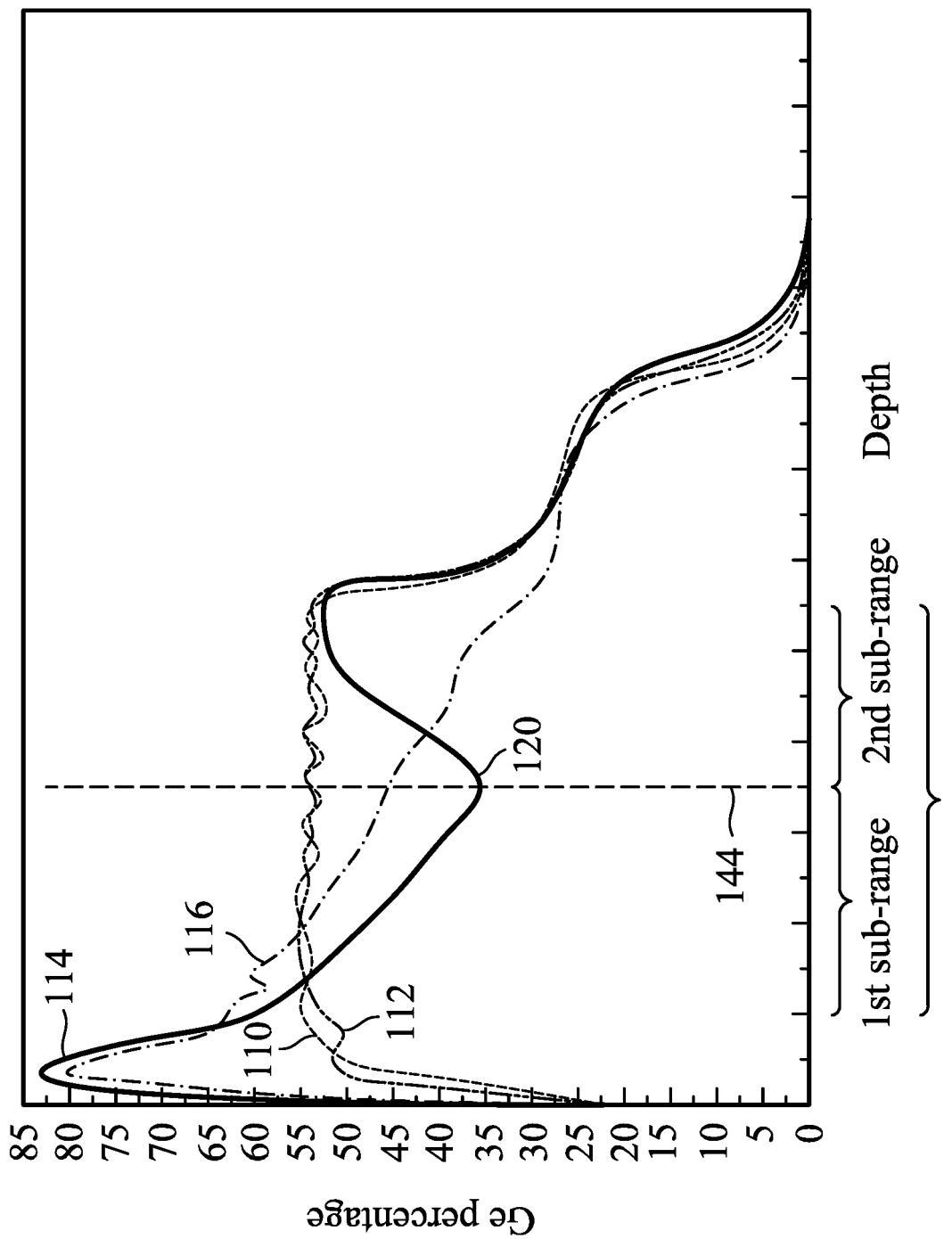
FIG. 18 illustrates the comparison of germanium percentages in accordance with some embodiments.

FIG. 18 illustrates experiment results of the germanium distribution of germanium in accordance with some embodiments, wherein germanium percentages are shown as a function of the depth into epitaxy silicon germanium region. The X-axis value of 0 corresponds to the top surface of epitaxy silicon germanium region, and the increase in the X-axis value corresponds to the increased depth into the silicon germanium region. Line 110 represents the germanium percentage before the PAI and anneal processes. Line 112 represents the germanium percentage with a non-melting anneal preformed. Line 112 is substantially overlapped with line 110, indicating that the non-melt anneal does not cause the redistribution of germanium. Line 114 represents the germanium percentage after a melt anneal performed with a lower power (and lower temperature). Line 116 represents the germanium percentage after a melt anneal performed with a higher power (and higher temperature). For line 114, the position 120 and the second sub-range shown in FIG. 18 represent the bottom of the molt portions. In a part of the second sub-range, there is a mix of liquid and solid. Accordingly, line 114 shows that germanium is drawn from the nearby regions of (X-axis) position 120, causing a valley at position 120, which valley is between two peaks of germanium percentages. For line 116, all of the illustrated portions of silicon germanium are molten. Accordingly, the germanium in the entire epitaxy region is redistributed to be gradually decreasing from top surface to the bottom surface of silicon germanium region.

Figure 19:
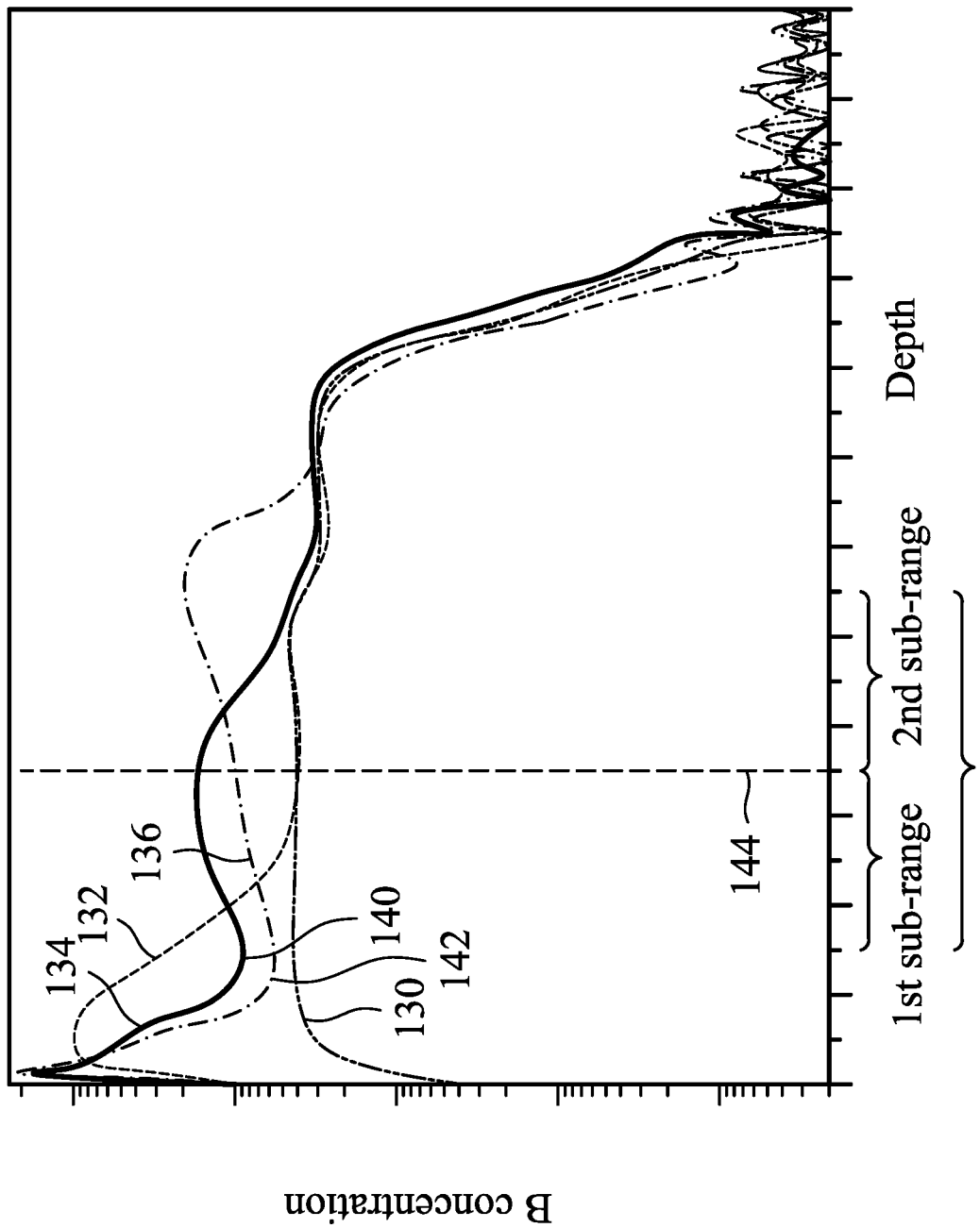
FIG. 19 illustrates the comparison of boron concentrations in accordance with some embodiments.

FIG. 19 illustrates the boron distribution in accordance with some embodiments, wherein boron percentages are shown as a function of depths into epitaxy silicon germanium region. The X-axis value of o corresponds to the top surface of epitaxy silicon germanium region, and the increase in the X-axis value corresponds to the increased depths into the silicon germanium region. Line 130 represents the boron concentration before the PAI and anneal processes. Line 132 represents the boron concentration with a non-melting anneal preformed. As shown by lines 130 and 132, the non-melting anneal also causes the redistribution of boron to the surface of silicon germanium region. Line 134 represents the boron concentration after a melt anneal performed with a lower power (and lower temperature). Line 136 represents the boron concentration after a melt anneal performed with a higher power (and higher temperature). Lines 134 and 136 reveal a significant phenomenon, that is, as a result of the melting of silicon germanium, boron concentration tends to be low in places where germanium percentage is high, and vice versa. Accordingly, boron concentration has valleys at (X-axis) positions 140 and 142 due to the peak of germanium percentage close to the top surface. Alternatively stated, for each of lines 134 and 136, when depths increase, the corresponding boron concentration first drops, and increase again. This occurs in the depth range in which germanium concentration (FIG. 18) continuously drops. Also, comparing line 114 in FIG. 18 and line 134 in FIG. 19, the low point 120 (FIG. 18) and high point 140 (FIG. 19) occur at the same depth as marked by lines 144. The depth range as marked as TR in FIGS. 18 and 19 has first sub-range on the left of line 144 and a second sub-range on the right of line 144. In the first sub-range, germanium concentrations continuously reduce, and boron concentrations continuously increase, and in the second sub-range, germanium concentrations continuously increase, and boron concentrations continuously reduce. Accordingly, the melt anneal results in some unique change in germanium percentage and boron concentration.

Figure 20:
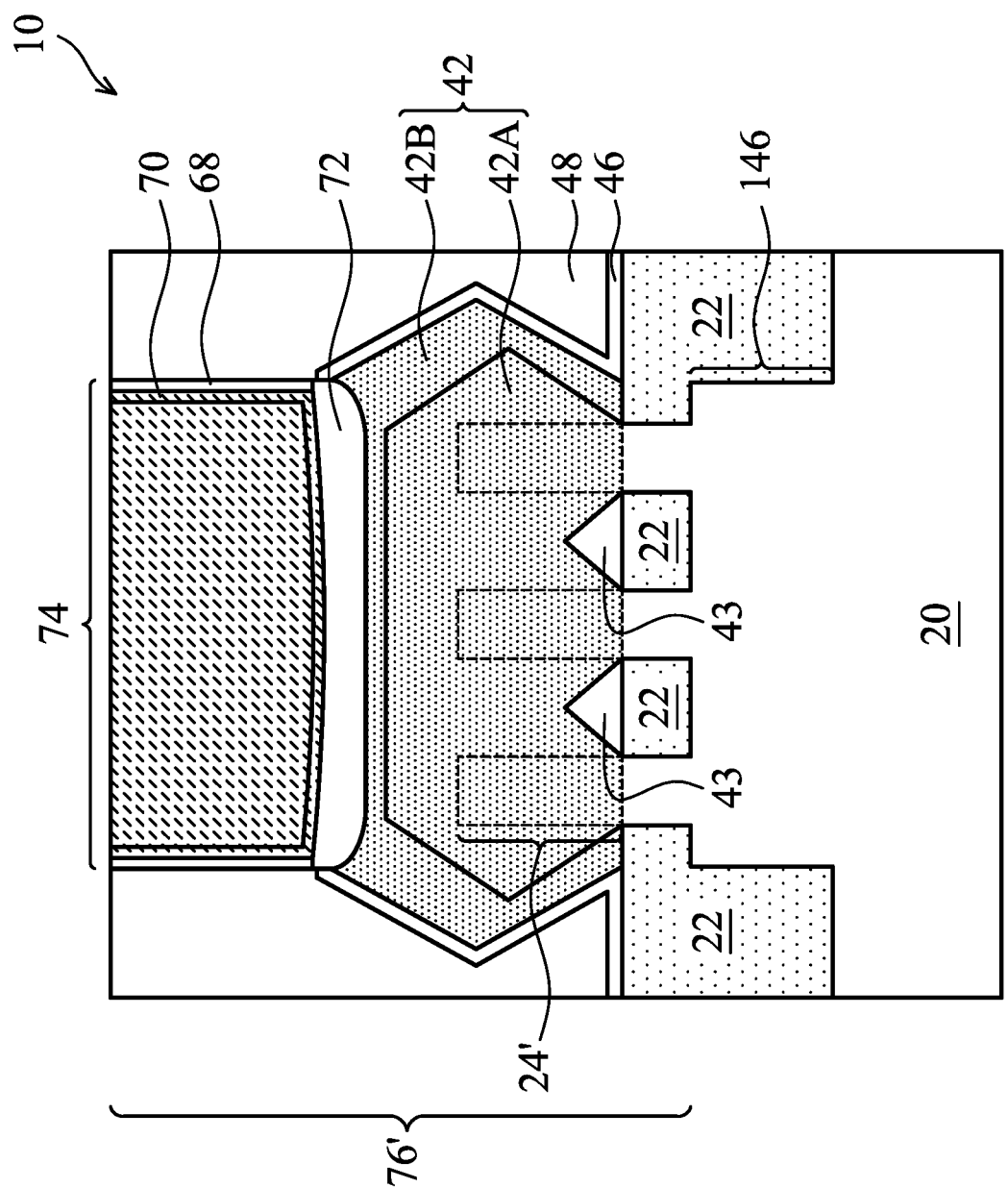
FIG. 20 illustrates a cross-sectional view of a FinFET formed on a crown-shaped semiconductor region in accordance with some embodiments.

In the FinFET shown in FIG. 14A, the fins 24' have a non-crown structure, in which a plurality of fins and the underlying semiconductor strips are directly connected to the bulk portion of substrate 20. FIG. 20 illustrates FinFET 76' in accordance with some embodiments of the present disclosure, in which fins are in a crown structure, which includes a semiconductor base 146, with protruding fins 24' and the underlying semiconductor strips over the semiconductor base.

The embodiments of the present disclosure have some advantageous features. Through the melt anneal, super activation may be achieved since in molten silicon germanium, boron can achieve a concentration much higher than the maximum concentration that can be achieved in solid phase doping. Since the melt anneal is achieved in very short time, in the portions of silicon germanium that are not molten, the diffusion of the impurity (such as boron) is minimized, resulting in improved short-channel effect and Drain Induced Barrier Lowering (DIBL) performance. Also due to the liquidation and the re-crystallization, the defects in source/drain region may be eliminated.

In accordance with some embodiments of the present disclosure, a method includes forming a gate stack on a first portion of a semiconductor substrate; removing a second portion of the semiconductor substrate on a side of the gate stack to form a recess; growing a semiconductor region starting from the recess; implanting the semiconductor region with an impurity; and performing a melt anneal on the semiconductor region, wherein at least a portion of the semiconductor region is molten during the melt anneal. In an embodiment, the growing the semiconductor region comprises growing a silicon germanium region. In an embodiment, the silicon germanium region is comprised in a p-type Fin Field-Effect Transistor (FinFET), and when the melt anneal is performed, a source/drain region of an n-type FinFET is annealed simultaneously, and the source/drain region of the n-type FinFET is not molten. In an embodiment, the semiconductor region comprises a lower portion and an upper portion over the lower portion, and in the melt anneal, the lower portion is not molten, and the upper portion is molten. In an embodiment, the lower portion has a first germanium percentage lower than a second germanium percentage of the upper portion. In an embodiment, a first portion of the semiconductor region is implanted, and a second portion of the semiconductor region is masked from the implanting, and in the melt anneal, the implanted first portion of the semiconductor region is molten, and the un-implanted second portion of the semiconductor region are not molten. In an embodiment, the un-implanted second portion of the semiconductor region that is not molten is at a same level as, and has a side edge contacting, the implanted first portion. In an embodiment, a void is underlying the semiconductor region, and portions of the semiconductor region exposed to the void are not molten. In an embodiment, the method further includes depositing a contact etch stop layer over the semiconductor region; forming an inter-layer dielectric over the contact etch stop layer; and etching the inter-layer dielectric and the contact etch stop layer to form a contact opening, wherein the implanting and the melt anneal is performed through the contact open.

In accordance with some embodiments of the present disclosure, a method includes etching a portion of a semiconductor fin on a side of a gate stack to form a recess; epitaxially growing a first silicon germanium layer, wherein the first silicon germanium layer is grown starting from the recess, and the first silicon germanium layer has a first germanium percentage; epitaxially growing a second silicon germanium layer over the first silicon germanium layer, wherein the second silicon germanium layer has a second germanium percentage higher than the first germanium percentage; performing an anneal, wherein during the anneal, the second silicon germanium layer is molten; and forming a silicide layer over and contacting the second silicon germanium layer. In an embodiment, the anneal comprises a laser anneal. In an embodiment, the anneal has a duration in a range between about 10 nanoseconds and about 1 microsecond. In an embodiment, during the anneal, the first silicon germanium layer remains as a solid. In an embodiment, the method further includes depositing a contact etch stop layer over the second silicon germanium layer; forming an inter-layer dielectric over the contact etch stop layer; and etching the inter-layer dielectric and the contact etch stop layer to form a contact opening, wherein the anneal is performed through the contact opening, and the anneal is performed by projecting a laser beam into the contact opening. In an embodiment, the method further includes amorphizing a first portion of the second silicon germanium layer, wherein a second portion of the second silicon germanium layer is free from amorphization, and during the anneal, the first portion of the second silicon germanium layer is molten, and the second portion of the second silicon germanium layer remains as a solid.

In accordance with some embodiments of the present disclosure, a device includes a first semiconductor fin and a second semiconductor fin protruding higher than a top surface of isolation regions, wherein the isolation regions comprise portions on opposite sides of each of the first semiconductor fin and the second semiconductor fin; a gate stack on a top surface and a sidewall of each of the first semiconductor fin and the second semiconductor fin; a source/drain region on a side of the gate stack, wherein the source/drain region comprises silicon germanium, and wherein the source/drain region has sidewalls contacting the first semiconductor fin and the second semiconductor fin; and a silicide layer over and forming an interface with the source/drain region, wherein in a cross-sectional view of the interface, the interface is continuously curved, with a lowest point of the interface being at a middle of the interface. In an embodiment, a highest germanium percentage in the source/drain region is at a level close to the interface. In an embodiment, a direction from a top surface of the source/drain region into the source/drain region, germanium percentages of the source/drain region have two peaks and a valley between the two peaks. In an embodiment, the source/drain region comprises boron, and in a depth range of the source/drain region, germanium concentrations have an opposite trend than boron concentrations. In an embodiment, the depth range has a first sub-range and a second sub-range joined to the first sub-range, wherein in the first sub-range, germanium concentrations continuously reduce, and boron concentrations continuously increase, and in the second sub-range, germanium concentrations continuously increase, and boron concentrations continuously reduce.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a gate stack on a first portion of a semiconductor substrate;
removing a second portion of the semiconductor substrate on a side of the gate stack to form a recess;
growing a semiconductor region starting from the recess;
implanting the semiconductor region with an impurity, wherein a first portion of the semiconductor region is implanted, and a second portion of the semiconductor region is masked from the implanting; and
performing a melt anneal on the semiconductor region, wherein in the melt anneal, the implanted first portion of the semiconductor region is molten, and the un-implanted second portion of the semiconductor region is not molten, and wherein the un-implanted second portion of the semiconductor region that is not molten is at a same level as, and has a side edge contacting, the implanted first portion.

2. The method of claim 1, wherein the growing the semiconductor region comprises growing a silicon germanium region.

3. The method of claim 2, wherein the silicon germanium region is comprised in a p-type Fin Field-Effect Transistor (FinFET), and when the melt anneal is performed, a source/drain region of an n-type FinFET is annealed simultaneously, and the source/drain region of the n-type FinFET is not molten.

4. The method of claim 1, wherein the semiconductor region comprises a lower portion lower than the implanted first portion, and in the melt anneal, the lower portion is not molten.

5. The method of claim 4, wherein the lower portion has a first germanium percentage lower than a second germanium percentage of the first portion of the semiconductor region.

6. The method of claim 1, wherein a void is underlying the semiconductor region, and portions of the semiconductor region exposed to the void are not molten.

7. The method of claim 1 further comprising:
depositing a contact etch stop layer over the semiconductor region;
forming an inter-layer dielectric over the contact etch stop layer; and
etching the inter-layer dielectric and the contact etch stop layer to form a contact opening, wherein the implanting and the melt anneal are performed through the contact open.

8. A method comprising:
etching a portion of a semiconductor fin on a side of a gate stack to form a recess;
epitaxially growing a first silicon germanium layer, wherein the first silicon germanium layer is grown starting from the recess, and the first silicon germanium layer has a first germanium percentage;

epitaxially growing a second silicon germanium layer over the first silicon germanium layer, wherein the second silicon germanium layer has a second germanium percentage higher than the first germanium percentage, wherein the first silicon germanium layer and the second silicon germanium layer form a first interface;

depositing a contact etch stop layer over the second silicon germanium layer;

forming an inter-layer dielectric over the contact etch stop layer;

etching the inter-layer dielectric and the contact etch stop layer to form a contact opening;

performing an anneal through the contact opening, wherein the anneal is performed by projecting a laser beam into the contact opening, wherein during the anneal, the second silicon germanium layer is molten, and the first silicon germanium layer remains as a solid, and wherein a second interface between a molten portion of the second silicon germanium layer and the solid is at a same position, and has a same shape as, the first interface; and forming a silicide layer over and contacting the second silicon germanium layer.

9. The method of claim 8, wherein the anneal comprises a laser anneal.

10. The method of claim 9, wherein the anneal has a duration in a range between about 10 nanoseconds and about 1 microsecond.

11. The method of claim 8 further comprising:

depositing a contact etch stop layer over the second silicon germanium layer;

forming an inter-layer dielectric over the contact etch stop layer; and etching the inter-layer dielectric and the contact etch stop layer to form a contact opening, wherein the anneal is performed through the contact opening, and the anneal is performed by projecting a laser beam into the contact opening.

12. The method of claim 8 further comprising:

amorphizing a first portion of the second silicon germanium layer, wherein a second portion of the second silicon germanium layer is free from amorphization, and during the anneal, the first portion of the second silicon germanium layer is molten, and the second portion of the second silicon germanium layer remains as a solid.

13. The method of claim 8, wherein the first interface and the second interface are at substantially a same position.

14. The method of claim 8, wherein the first silicon germanium layer has a void therein, and after the anneal, the void is separated from the molten second silicon germanium layer by a part of the solid.

15. The method of claim 8, wherein the inter-layer dielectric comprises a planar surface comprising a first portion and a second portion joined with each other, and after the contact opening is formed, the first portion is removed, and the second portion remains.

16. The method of claim 8, wherein as a result of the anneal, substantially an entirety of the second silicon germanium layer is molten, and substantially an entirety of the first silicon germanium layer is not molten.

17. The method of claim 8, wherein the amorphizing is performed through the contact opening.

18. A method comprising:

forming a gate stack over a semiconductor region;

forming a source/drain region on a side of the gate stack;

amorphizing a portion of the source/drain region to form an amorphous region;

melting a top portion of the source/drain region, wherein a bottom portion of the source/drain region remains to be solid, and wherein the top portion of the source/drain region molten by the melting comprises the amorphous region and an additional portion of the source/drain region directly underlying the amorphous region, wherein during the amorphizing, the additional portion of the source/drain region is un-amorphized; and forming a silicide layer over and contacting the source/drain region.

19. The method of claim 18, wherein the top portion of the source/drain region molten by the melting has a higher germanium concentration than the bottom portion.

20. The method of claim 18, wherein during the melting, the bottom portion of the source/drain region remaining as the solid has a lower germanium percentage than the top portion of the source/drain region.

21. The method of claim 18, wherein a further portion of the source/drain region at a same level as the top portion is not molten.

* * * * *